United States Patent
Kim

(10) Patent No.: US 9,486,672 B2
(45) Date of Patent: Nov. 8, 2016

(54) PROCESS FOR DESIGNING RUGGED PATTERN ON GOLF BALL SURFACE

(75) Inventor: Hyoungchol Kim, Kobe (JP)

(73) Assignee: DUNLOP SPORTS CO. LTD., Kobe-Shi (JP)

( * ) Notice: Subject to any disclaimer, the term of this patent is extended or adjusted under 35 U.S.C. 154(b) by 799 days.

(21) Appl. No.: 13/537,540

(22) Filed: Jun. 29, 2012

(65) Prior Publication Data

US 2013/0005510 A1    Jan. 3, 2013

(30) Foreign Application Priority Data

Jun. 30, 2011  (JP) .................................. 2011-145793

(51) Int. Cl.
| | | |
|---|---|---|
| A63B 37/12 | (2006.01) | |
| A63B 37/14 | (2006.01) | |
| A63B 37/00 | (2006.01) | |
| G06F 17/50 | (2006.01) | |
| A63B 45/00 | (2006.01) | |
| G06T 17/20 | (2006.01) | |

(52) U.S. Cl.
CPC ......... *A63B 37/0004* (2013.01); *A63B 37/002* (2013.01); *A63B 37/0006* (2013.01); *A63B 45/00* (2013.01); *G06F 17/50* (2013.01); *G06T 17/20* (2013.01); *A63B 37/0007* (2013.01); *A63B 37/0018* (2013.01); *A63B 37/0021* (2013.01)

(58) Field of Classification Search
USPC .......................................... 473/378–384, 409
See application file for complete search history.

(56) References Cited

U.S. PATENT DOCUMENTS

| | | | |
|---|---|---|---|
| 4,729,861 A | 3/1988 | Lynch et al. | |
| 4,744,564 A | 5/1988 | Yamada | |
| 4,936,587 A | 6/1990 | Lynch et al. | |
| 5,080,367 A | 1/1992 | Lynch et al. | |
| 5,688,194 A | 11/1997 | Stiefel et al. | |
| 5,772,532 A | 6/1998 | Stiefel et al. | |
| 5,965,235 A * | 10/1999 | McGuire et al. | 428/156 |
| 6,176,793 B1 * | 1/2001 | Sullivan et al. | 473/378 |
| 6,254,496 B1 * | 7/2001 | Maehara et al. | 473/378 |
| 6,409,615 B1 | 6/2002 | McGuire et al. | |
| 6,702,696 B1 * | 3/2004 | Nardacci | 473/383 |
| 7,473,194 B2 * | 1/2009 | Nardacci | 473/383 |
| 8,301,418 B2 * | 10/2012 | Kim | 703/1 |
| 2003/0158002 A1 * | 8/2003 | Morgan et al. | 473/383 |
| 2004/0082409 A1 * | 4/2004 | Kasashima | 473/383 |
| 2005/0176525 A1 * | 8/2005 | Nardacci | 473/378 |

(Continued)

FOREIGN PATENT DOCUMENTS

| | | |
|---|---|---|
| JP | 2004-505735 A | 2/2004 |
| JP | 2009-291315 A | 12/2009 |

(Continued)

*Primary Examiner* — Gene Kim
*Assistant Examiner* — Matthew B Stanczak
(74) *Attorney, Agent, or Firm* — Birch, Stewart, Kolasch & Birch, LLP

(57) ABSTRACT

A golf ball 2 has, on a surface thereof, a rugged pattern consisting of a land 10 and a large number of dimples 8. A method for designing the rugged pattern includes the steps of:
(1) randomly arranging a large number of generating points on the surface of a phantom sphere;
(2) assuming a large number of Voronoi regions on the surface of the phantom sphere based on the generating points; and
(3) assigning a land to the vicinity of the contour of each Voronoi region and assigning a dimple to a portion of the surface of the phantom sphere other than the land.

5 Claims, 49 Drawing Sheets

(56) References Cited

U.S. PATENT DOCUMENTS

| | | | |
|---|---|---|---|
| 2005/0266934 A1* | 12/2005 | Morgan et al. | 473/383 |
| 2006/0172824 A1* | 8/2006 | Nardacci et al. | 473/378 |
| 2009/0298618 A1 | 12/2009 | Kim et al. | |
| 2010/0088071 A1 | 4/2010 | Kim | |
| 2010/0234141 A1 | 9/2010 | Kim et al. | |
| 2014/0295997 A1* | 10/2014 | Kim et al. | 473/378 |
| 2015/0031477 A1* | 1/2015 | Sajima et al. | 473/383 |

FOREIGN PATENT DOCUMENTS

| | | |
|---|---|---|
| JP | 2010-88640 A | 4/2010 |
| JP | 2010-213741 A | 9/2010 |

* cited by examiner 20  16a(16)  18

132   132   132

PROCESS FOR DESIGNING RUGGED PATTERN ON GOLF BALL SURFACE

This application claims priority on Patent Application No. 2011-145793 filed in JAPAN on Jun. 30, 2011. The entire contents of this Japanese Patent Application are hereby incorporated by reference.

BACKGROUND OF THE INVENTION

1. Field of the Invention

The present invention relates to golf balls. Specifically, the present invention relates to processes for designing a rugged pattern on a golf ball surface.

2. Description of the Related Art

Golf balls have a large number of dimples on the surface thereof. The dimples disturb the air flow around the golf ball during flight to cause turbulent flow separation. By causing the turbulent flow separation, separation points of the air from the golf ball shift backwards leading to a reduction of drag. The turbulent flow separation promotes the displacement between the separation point on the upper side and the separation point on the lower side of the golf ball, which results from the backspin, thereby enhancing the lift force that acts upon the golf ball. The reduction of drag and the enhancement of lift force are referred to as a "dimple effect".

The United States Golf Association (USGA) has established the rules about symmetry of golf balls. According to the rules, the trajectory during PH (pole horizontal) rotation and the trajectory during POP (pole over pole) rotation are compared with each other. A golf ball having a large difference between these two trajectories does not conform to the rules. In other words, a golf ball having inferior aerodynamic symmetry does not conform to the rules. A golf ball with inferior aerodynamic symmetry has a short flight distance because the aerodynamic characteristic of the golf ball for PH rotation or for POP rotation is inferior. The rotation axis for PH rotation extends through the poles of the golf ball, and the rotation axis for POP rotation is orthogonal to the rotation axis for PH rotation.

The dimples can be arranged by using a regular polyhedron that is inscribed in the phantom sphere of a golf ball. In this arrangement method, the surface of the phantom sphere is divided into a plurality of units by division lines obtained by projecting the sides of the polyhedron on the spherical surface. The dimple pattern of one unit is developed all over the phantom sphere. According to this dimple pattern, the aerodynamic characteristic in the case where a line passing through a vertex of the regular polyhedron is a rotation axis is different from that in the case where a line passing through the center of a surface of the regular polyhedron is a rotation axis. Such a golf ball has inferior aerodynamic symmetry.

JP50-8630 (U.S. Pat. Nos. 4,729,861, 4,936, 587, and 5,080,367) discloses a golf ball having an improved dimple pattern. The surface of the golf ball is divided by an icosahedron that is inscribed in the phantom sphere thereof. Based on this division, dimples are arranged on the surface of the golf ball. According to this dimple pattern, the number of great circles that do not intersect any dimples is 1. This great circle agrees with the equator of the golf ball. The region near the equator is a unique region.

Generally, a golf ball is formed by a mold including upper and lower mold halves. The mold has a parting line. A golf ball obtained by this mold has a seam at a position along the parting line. Through this forming, spew occurs along the seam. The spew is removed by means of cutting. By cutting the spew, the dimples near the seam are deformed. In addition, the dimples near the seam tend to be orderly arranged. The seam is located along the equator of the golf ball. The region near the equator is a unique region.

A mold having an uneven parting line has been used. A golf ball obtained by this mold has dimples on the equator thereof. The dimples on the equator contribute to eliminating the uniqueness of the region near the equator. However, the uniqueness is not sufficiently eliminated. This golf ball has insufficient aerodynamic symmetry.

JP61-284264 (U.S. Pat. No. 4,744,564) discloses a golf ball in which the dimples near the seam are greater in volume than the dimples near the poles. This volume difference contributes to eliminating the uniqueness of the region near the equator. This golf ball eliminates, by the volume difference of dimples, the disadvantage caused by the dimple pattern. The disadvantage is eliminated not by modification of the dimple pattern. In the golf ball, the potential of the dimple pattern is sacrificed. The flight distance of the golf ball is insufficient.

JP9-164223 (U.S. Pat. Nos. 5,688,194 and 5,772,532) discloses a golf ball in which a large number of dimples are randomly arranged. The random arrangement enhances aerodynamic symmetry. JP2000-189542 (U.S. Pat. No. 6,254,496) also discloses a golf ball in which a large number of dimples are randomly arranged.

In a method disclosed in JP9-164223, a process of trial and error is conducted in order to obtain a desired dimple pattern. In a method disclosed in JP2000-189542 as well, a process of trial and error is conducted in order to obtain a desired dimple pattern.

An object of the present invention is to provide a golf ball having excellent aerodynamic symmetry.

SUMMARY OF THE INVENTION

A process for designing a rugged pattern on a golf ball surface according to the present invention includes the steps of:

(1) randomly arranging a large number of points on a surface of a phantom sphere;

(2) assuming a large number of regions on the surface of the phantom sphere based on the points; and (3) assigning a dimple and a land to the surface of the phantom sphere based on contours of the regions.

Preferably, at the step (2), a large number of the regions are assumed on the surface of the phantom sphere such that one of the points is included in one of the regions. Preferably, at the step (2), the regions are assumed by a Voronoi tessellation.

Preferably, the step (2) includes the steps of:

(2.1) assuming a large number of minute cells on the surface of the phantom sphere;

(2.2) selecting a generating point that is closest to each cell;

(2.3) assuming, for each generating point, a set of cells for which said each generating point is a closest generating point; and (2.4) setting each set as a region obtained by the Voronoi tessellation.

At the step (2), a large number of the regions may be assumed on the surface of the phantom sphere by connecting one point to another point by a line. Preferably, at the step (2), the regions are assumed by a Delaunay triangulation.

Preferably, at the step (3), the land is assigned to a vicinity of each contour, and the dimple is assigned to a portion of the surface of the phantom sphere other than the land.

Preferably, at the step (1), a large number of the points are randomly arranged based on a Cellular Automaton method.

Preferably, the step (1) includes the steps of:

(1.1) assuming a plurality of states;

(1.2) assuming a large number of cells on the surface of the phantom sphere;

(1.3) assigning any one of the states to each cell;

(1.4) assigning, as an attribute of said each cell, any one of INSIDE, OUTSIDE, and BOUNDARY to said each cell based on the state of said each cell and states of a plurality of cells located adjacent to said each cell;

(1.5) assuming a loop by connecting cells of BOUNDARY; and (1.6) deciding a central point of the loop.

A golf ball according to the present invention has a large number of dimples on a surface thereof. The dimples are randomly arranged. Each dimple has a contour shape different from that of any of the other dimples.

Preferably, a fluctuation range Rh and a fluctuation range Ro are equal to or less than 2.7 mm and are obtained by the steps of:

(1) assuming a line which connects both poles of the golf ball, as a first rotation axis;

(2) assuming a great circle which exists on a surface of a phantom sphere of the golf ball and is orthogonal to the first rotation axis;

(3) assuming two small circles which exist on the surface of the phantom sphere of the golf ball, which are orthogonal to the first rotation axis, and of which an absolute value of a central angle with the great circle is 30°;

(4) defining a region, of the surface of the golf ball, which is obtained by dividing the golf ball at the two small circles and which is sandwiched between the two small circles;

(5) determining 30240 points on the region at intervals of a central angle of 3° in a direction of the first rotation axis and at intervals of a central angle of 0.25° in a direction of rotation about the first rotation axis;

(6) calculating a length L1 of a perpendicular line which extends from each point to the first rotation axis;

(7) calculating a total length L2 by summing twenty-one lengths L1 calculated based on twenty-one perpendicular lines arranged in the direction of the first rotation axis;

(8) determining a maximum value and a minimum value among 1440 total lengths L2 calculated along the direction of rotation about the first rotation axis, and calculating a fluctuation range Rh by subtracting the minimum value from the maximum value;

(9) assuming a second rotation axis orthogonal to the first rotation axis assumed at the step (1);

(10) assuming a great circle which exists on the surface of the phantom sphere of the golf ball and is orthogonal to the second rotation axis;

(11) assuming two small circles which exist on the surface of the phantom sphere of the golf ball, which are orthogonal to the second rotation axis, and of which an absolute value of a central angle with the great circle is 30°;

(12) defining a region, of the surface of the golf ball, which is obtained by dividing the golf ball at the two small circles and which is sandwiched between the two small circles;

(13) determining 30240 points on the region at intervals of a central angle of 3° in a direction of the second rotation axis and at intervals of a central angle of 0.25° in a direction of rotation about the second rotation axis;

(14) calculating a length L1 of a perpendicular line which extends from each point to the second rotation axis;

(15) calculating a total length L2 by summing twenty-one lengths L1 calculated based on twenty-one perpendicular lines arranged in the direction of the second rotation axis; and

(16) determining a maximum value and a minimum value among 1440 total lengths L2 calculated along the direction of rotation about the second rotation axis, and calculating a fluctuation range Ro by subtracting the minimum value from the maximum value.

Preferably, an absolute value of a difference dR between the fluctuation range Rh and the fluctuation range Ro is equal to or less than 0.4 mm.

DESCRIPTION OF THE PREFERRED EMBODIMENTS

The following will describe in detail the present invention based on preferred embodiments with reference to the accompanying drawings.

Figure 1:
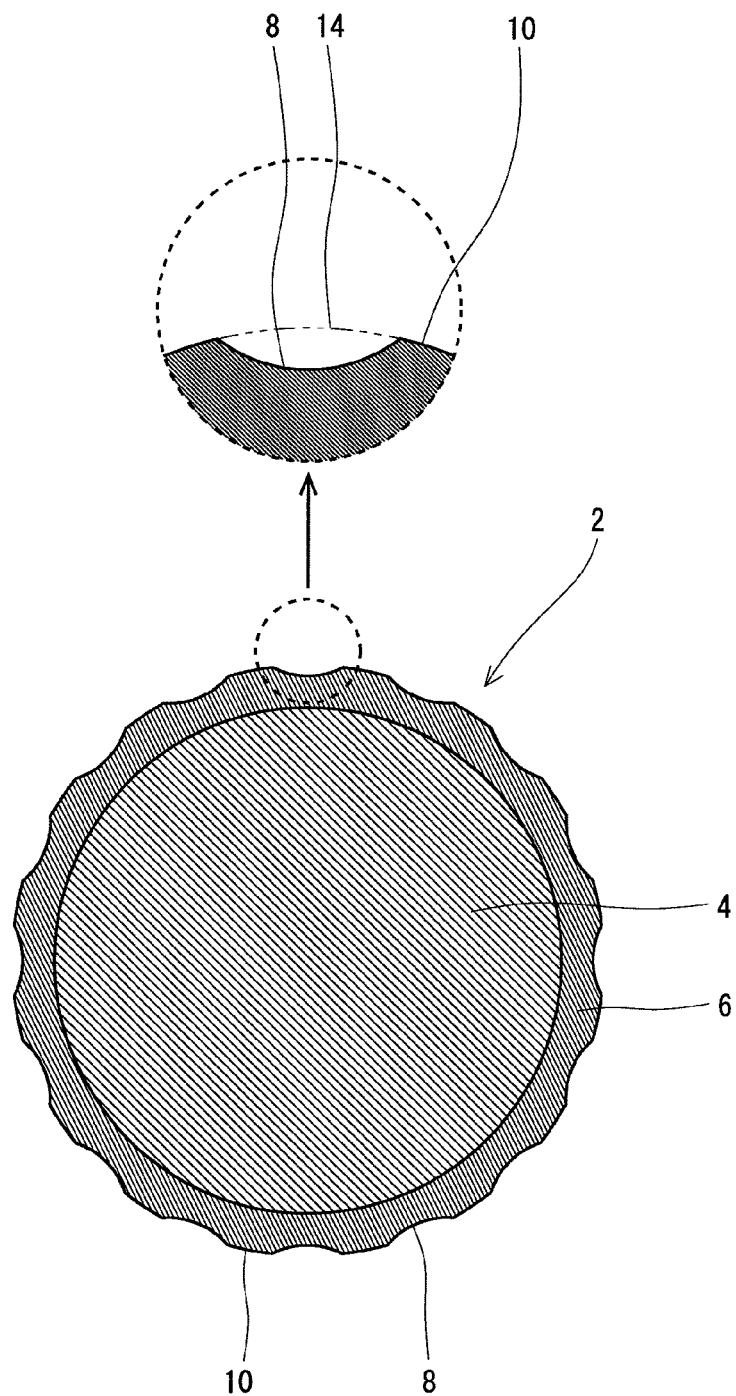
FIG. 1 is a schematic cross-sectional view of a golf ball according to one embodiment of the present invention.

A golf ball 2 shown in FIG. 1 includes a spherical core 4 and a cover 6. On the surface of the cover 6, a large number of dimples 8 are formed. Of the surface of the golf ball 2, a part other than the dimples 8 is a land 10. The golf ball 2 includes a paint layer and a mark layer on the external side of the cover 6 although these layers are not shown in the drawing. A mid layer may be provided between the core 4 and the cover 6.

The golf ball 2 has a diameter of preferably 40 mm or greater but 45 mm or less. From the standpoint of conformity to the rules established by the United States Golf Association (USGA), the diameter is particularly preferably equal to or greater than 42.67 mm. In light of suppression of air resistance, the diameter is more preferably equal to or less than 44 mm and particularly preferably equal to or less than 42.80 mm. The golf ball 2 has a weight of preferably 40 g or greater but 50 g or less. In light of attainment of great inertia, the weight is more preferably equal to or greater than 44 g and particularly preferably equal to or greater than 45.00 g. From the standpoint of conformity to the rules established by the USGA, the weight is particularly preferably equal to or less than 45.93 g.

The core 4 is formed by crosslinking a rubber composition. Examples of base rubbers for use in the rubber composition include polybutadienes, polyisoprenes, styrene-butadiene copolymers, ethylene-propylene-diene copolymers, and natural rubbers. Two or more rubbers may be used in combination. In light of resilience performance, polybutadienes are preferred, and, high-cis polybutadienes are particularly preferred.

In order to crosslink the core 4, a co-crosslinking agent can be used. Examples of preferable co-crosslinking agents in light of resilience performance include zinc acrylate, magnesium acrylate, zinc methacrylate, and magnesium methacrylate. Preferably, the rubber composition includes an organic peroxide together with a co-crosslinking agent. Examples of suitable organic peroxides include dicumyl peroxide, 1,1-bis (t-butylperoxy)-3,3,5-trimethylcyclohexane, 2,5-dimethyl-2,5-di(t-butylperoxy)hexane, and di-t-butyl peroxide.

According to need, various additives such as sulfur, a sulfur compound, a filler, an anti-aging agent, a coloring agent, a plasticizer, a dispersant, and the like are included in the rubber composition of the core 4 in an adequate amount. Crosslinked rubber powder or synthetic resin powder may also be included in the rubber composition.

The core 4 has a diameter of 30.0 mm or greater and particularly 38.0 mm or greater. The diameter of the core 4 is equal to or less than 42.0 mm and particularly equal to or less than 41.5 mm. The core 4 may be composed of two or more layers. The core 4 may have a rib on its surface.

A suitable polymer for the cover 6 is an ionomer resin. Examples of preferable ionomer resins include binary copolymers formed with an α-olefin and an α,β-unsaturated carboxylic acid having 3 to 8 carbon atoms. Examples of other preferable ionomer resins include ternary copolymers formed with: an α-olefin; an α,β-unsaturated carboxylic acid having 3 to 8 carbon atoms; and an α,β-unsaturated carboxylate ester having 2 to 22 carbon atoms. For the binary copolymers and ternary copolymers, preferable α-olefins are ethylene and propylene, while preferable α,β-unsaturated carboxylic acids are acrylic acid and methacrylic acid. In the binary copolymers and ternary copolymers, some of the carboxyl groups are neutralized with metal ions. Examples of metal ions for use in neutralization include sodium ion, potassium ion, lithium ion, zinc ion, calcium ion, magnesium ion, aluminum ion, and neodymium ion.

Another polymer may be used instead of or together with an ionomer resin. Examples of the other polymer include thermoplastic polyurethane elastomers, thermoplastic styrene elastomers, thermoplastic polyamide elastomers, thermoplastic polyester elastomers, and thermoplastic polyolefin elastomers. In light of spin performance, thermoplastic polyurethane elastomers are preferred.

According to need, a coloring agent such as titanium dioxide, a filler such as barium sulfate, a dispersant, an antioxidant, an ultraviolet absorber, a light stabilizer, a fluorescent material, a fluorescent brightener, and the like are included in the cover 6 in an adequate amount. For the purpose of adjusting specific gravity, powder of a metal with a high specific gravity such as tungsten, molybdenum, and the like may be included in the cover 6.

The cover 6 has a thickness of 0.1 mm or greater and particularly 0.3 mm or greater. The thickness of the cover 6 is equal to or less than 2.5 mm and particularly equal to or less than 2.2 mm. The cover 6 has a specific gravity of 0.90 or greater and particularly 0.95 or greater. The specific gravity of the cover 6 is equal to or less than 1.10 and particularly equal to or less than 1.05. The cover 6 may be composed of two or more layers.

Figure 2:
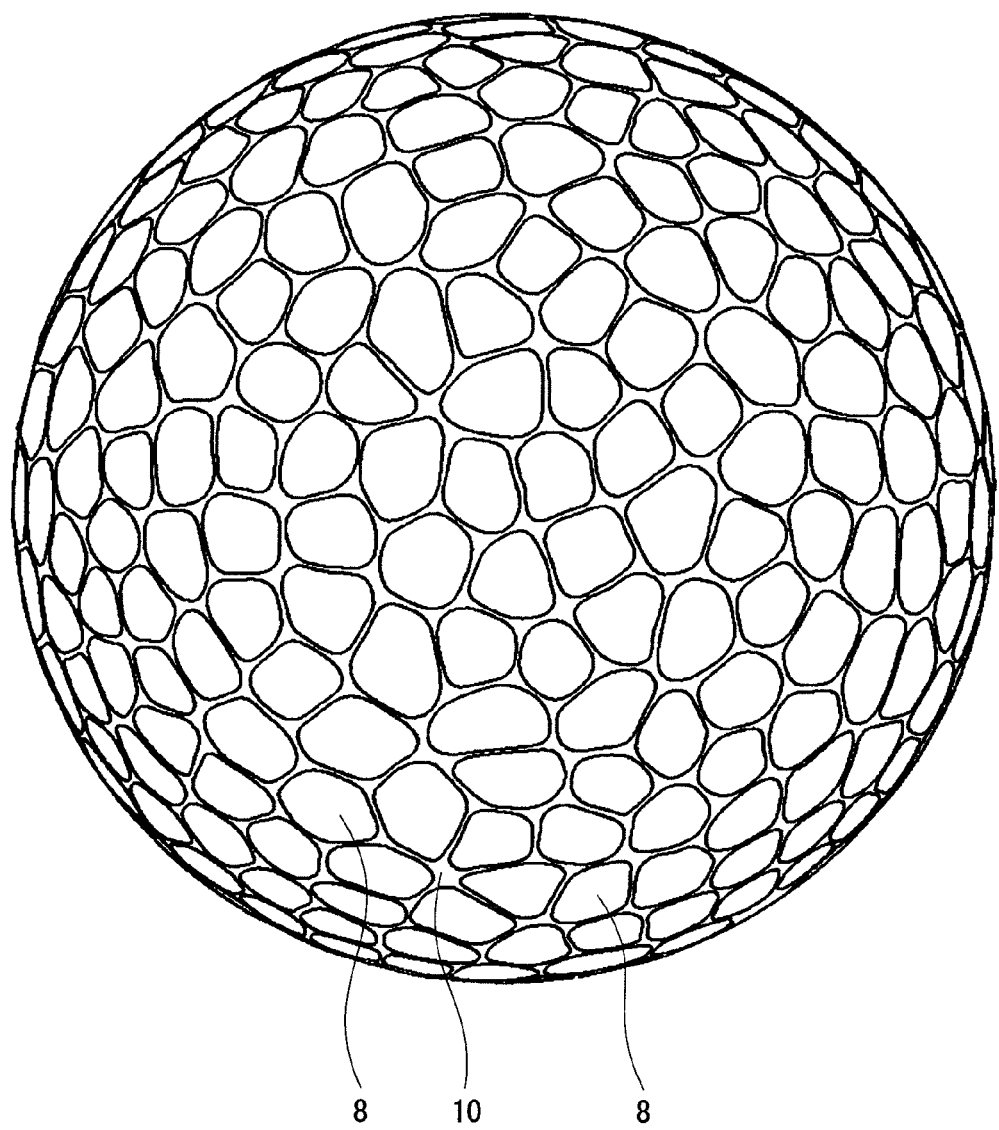
FIG. 2 is an enlarged front view of the golf ball in FIG. 1.
Figure 3:
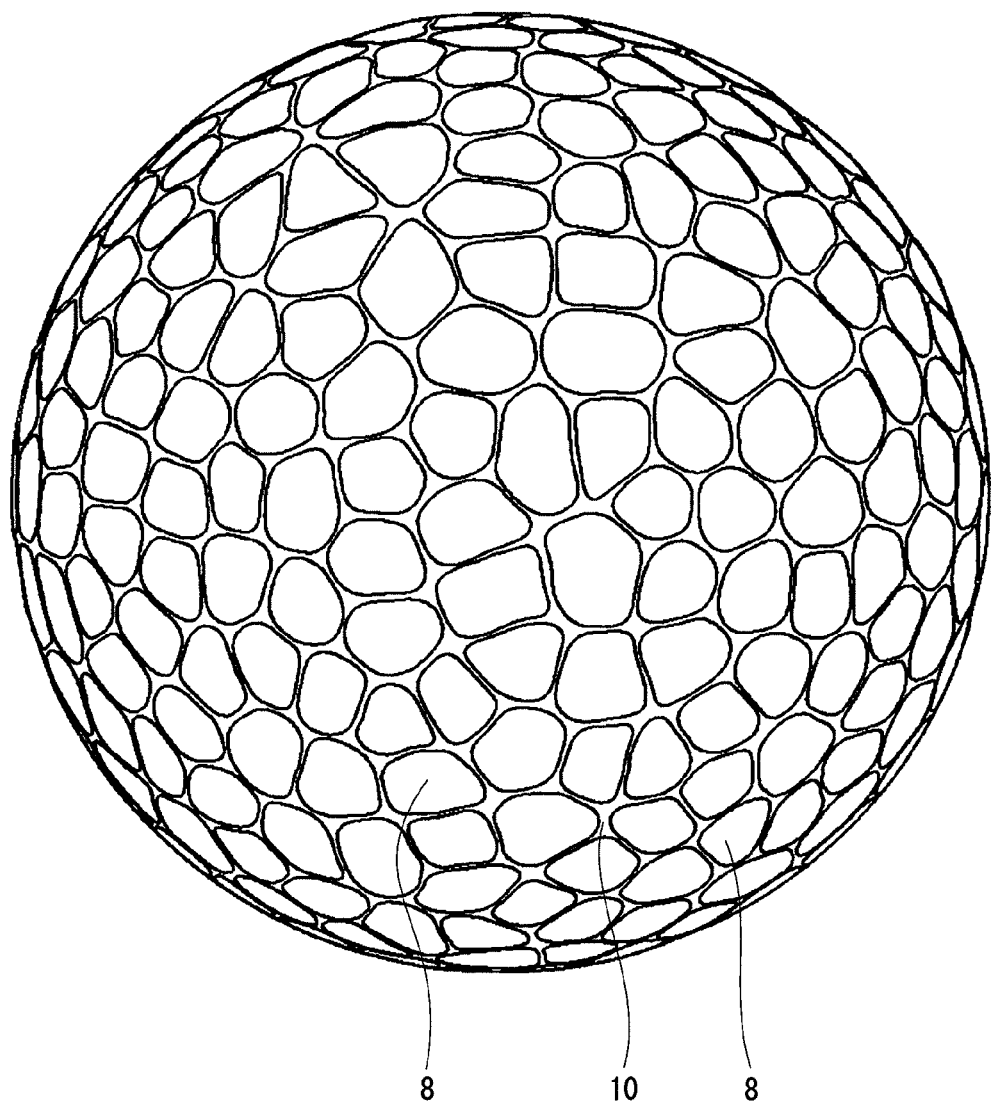
FIG. 3 is a plan view of the golf ball in FIG. 2.

FIG. 2 is an enlarged front view of the golf ball 2. FIG. 3 is a plan view of the golf ball 2 in FIG. 2. As is obvious from FIGS. 2 and 3, a large number of the dimples 8 are randomly arranged. By these dimples 8 and the land 10, a rugged pattern is formed on the surface of the golf ball 2.

In a process for designing the rugged pattern, a Voronoi tessellation is used. In the designing process, a large number of generating points are randomly arranged on the surface of a phantom sphere 14 (see FIG. 1). A large number of regions are assumed on the surface of the phantom sphere 14 based on the generating points by the Voronoi tessellation. In the present specification, these regions are referred to as "Voronoi regions". Dimples 8 are assigned based on these Voronoi regions. The designing process is preferably executed using a computer and software in light of efficiency. Of course, the present invention is practicable even by hand calculation. The essence of the present invention is not in a computer and software.

Preferably, a Cellular Automaton method is used for arranging the generating points. By the Cellular Automaton method, a pattern in which a large number of loops are randomly arranged on the surface of the phantom sphere 14 is obtained. The central points of these loops are set as generating points. Since the arrangement of the loops is random, the arrangement of the generating points is also random.

The Cellular Automaton method is widely used in the fields of computability theory, mathematics, theoretical biology, and the like. A model of the Cellular Automaton method consists of a large number of cells and simple rules. By this model, natural phenomena such as life phenomena, crystal growth, turbulent flow, and the like can be simulated. In this model, each cell has a state. This state can change to another state as a stage proceeds. The state of a cell at stage (t+1) is decided by the state of this cell and the states of a plurality of cells adjacent to this cell at stage (t). This decision is performed according to a rule. This rule is equally applied to all the cells.

For designing the rugged pattern, a reaction-diffusion model of the Cellular Automaton method is suitable. This model is used for simulating loops on body surfaces of beasts, birds, fish, insects, and the like. In this model, a plurality of states are assumed. The number of states is normally equal to or greater than 2 but equal to or less than 8. For each cell, an initial state is decided. As a stage proceeds, the state is updated according to a rule. There are cells whose states change by this update, while there are also cells whose states do not change by this update. The Cellular Automaton method is disclosed at Pages 25 to 28 of "Cellular Automaton method, Self-organization of Complex Systems and Massively Parallel Processing" (written by Yasuyoshi Kato et al, published by Morikita Publishing Co., Ltd.).

A designing process according to the present invention is characterized in that the state of a cell is updated under the influence of other cells adjacent to this cell. By this update, a pattern in which a large number of loops are randomly arranged is obtained. As long as this characteristic is maintained, any model can be used. The following will describe in detail a designing process using a reaction-diffusion model of the Cellular Automaton method.

Figure 4:
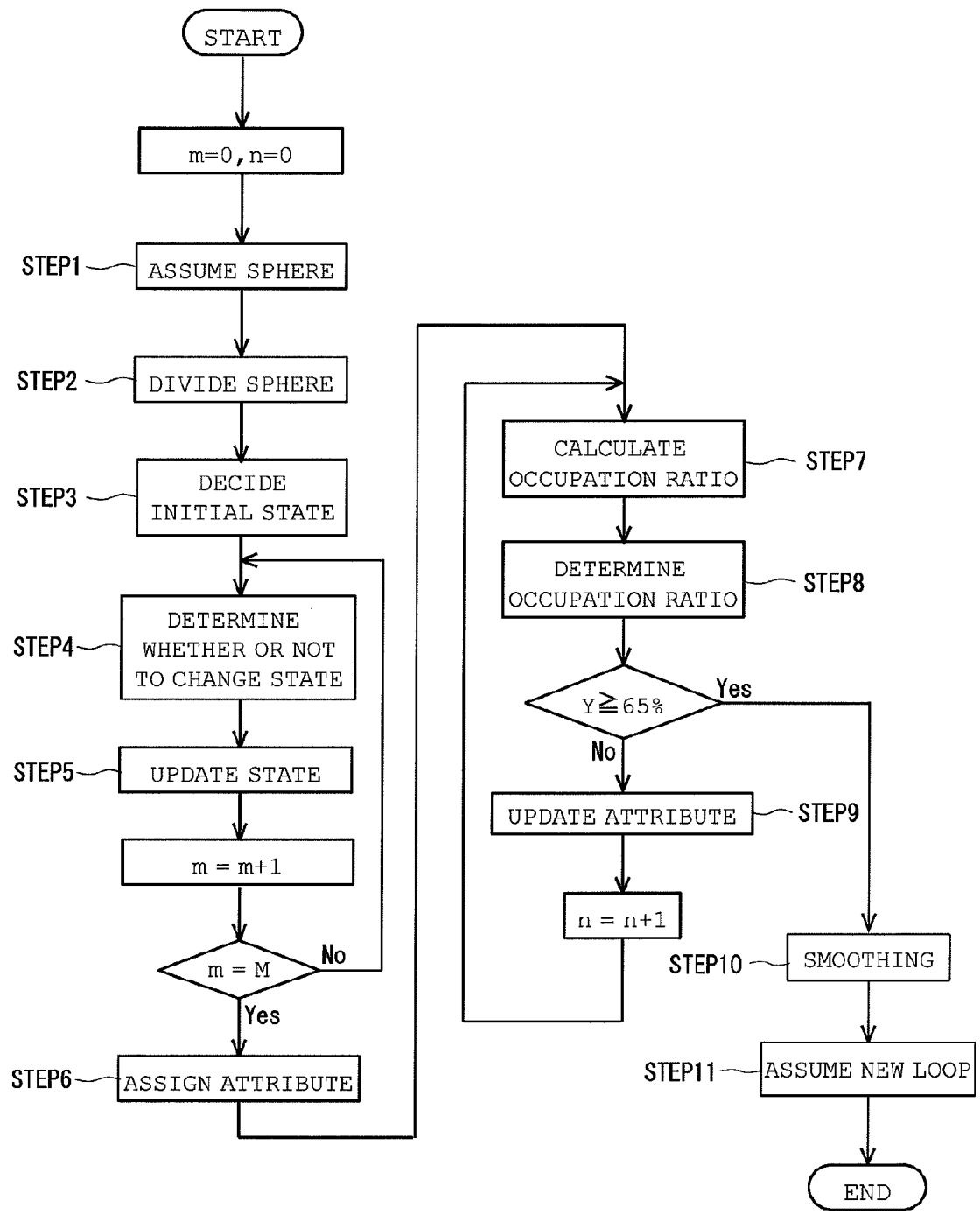
FIG. 4 is a flowchart of a process for designing a pattern of loops.
Figure 5:
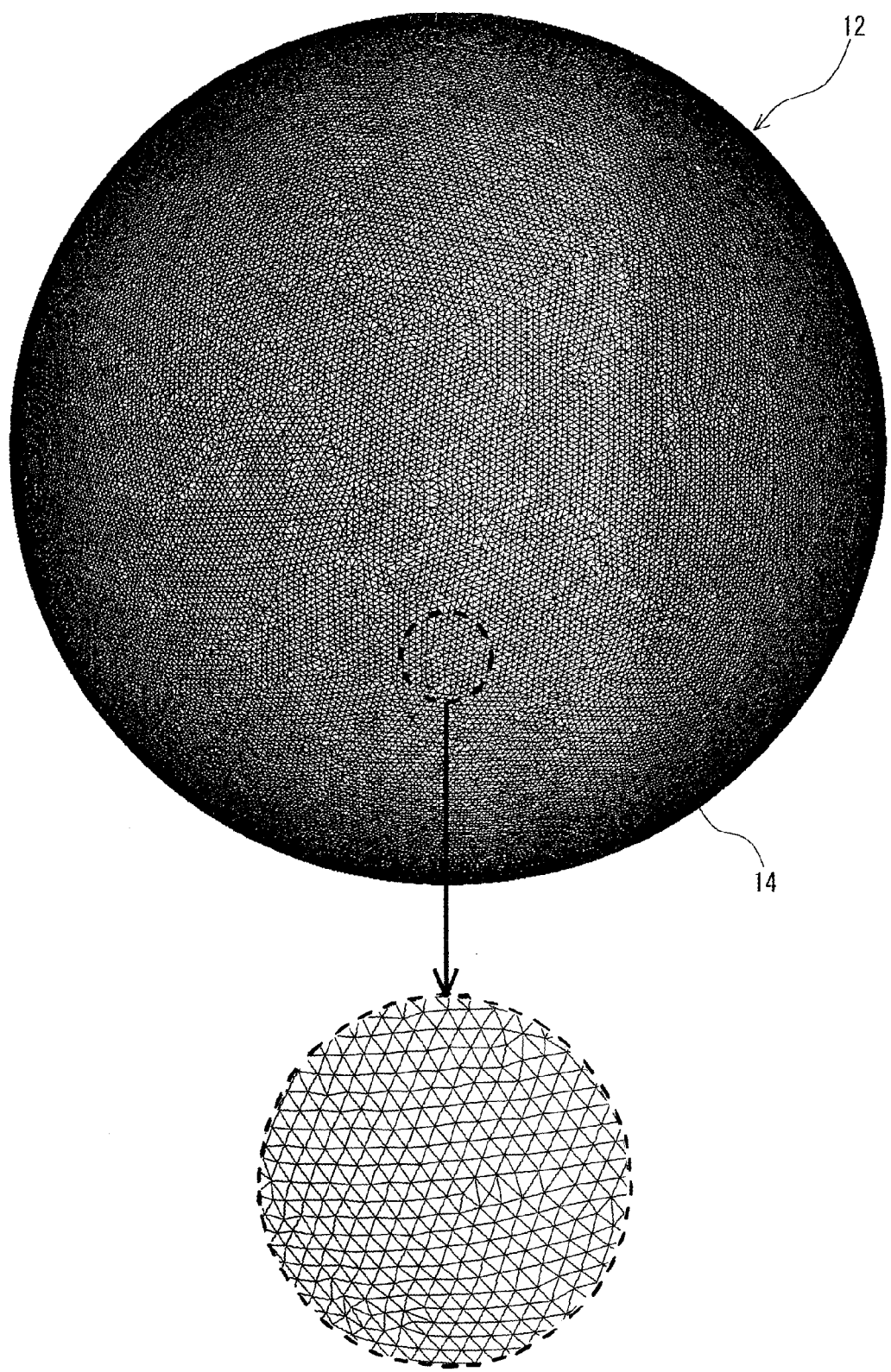
FIG. 5 is a front view of a mesh used in the designing process in FIG. 4.

FIG. 4 is a flowchart of a process for designing a pattern of loops. FIG. 5 is a front view of a mesh 12 used in the designing process in FIG. 4. For forming the mesh 12, a sphere 14 is assumed (STEP 1). The diameter of the phantom sphere 14 is the same as that of the golf ball 2. The surface of the phantom sphere 14 is divided into a large number of triangles (STEP 2). This division is performed based on an advancing front method. The advancing front method is disclosed at Pages 195 to 197 of "Graduate School of Information Science and Technology 3, Computational Dynamics" (edited by Kouichi ITO, published by Kodansha Ltd.). The mesh 12 has 176528 triangles and 88266 vertices. Each vertex is defined as a cell (or the center of a cell). The mesh 12 has 88266 cells. The phantom sphere 14 may be divided by other methods.

In the designing process, two states, a differentiated state and an undifferentiated state, are assumed. For each cell, either state (an initial state) is decided (STEP 3). The decision is preferably performed in a random manner. For the random decision, random numbers and a residue system are used. Because the number of states is 2, a residue system having a base of 2 is used. Specifically, a random number to 5 decimal places, which is equal to or greater than 0 and less than 1, is generated by a computer. The random number is multiplied by 100000, and the product is divided by 2. The remainder for the division is "1" or "0". Based on the remainder, the state of the cell is decided. For example, when the remainder is "1", the differentiated state is selected, and when the remainder is "0", the undifferentiated state is selected. For all the cells, this decision is performed. The mesh 12 after the decision is at stage 1.

Figure 6:
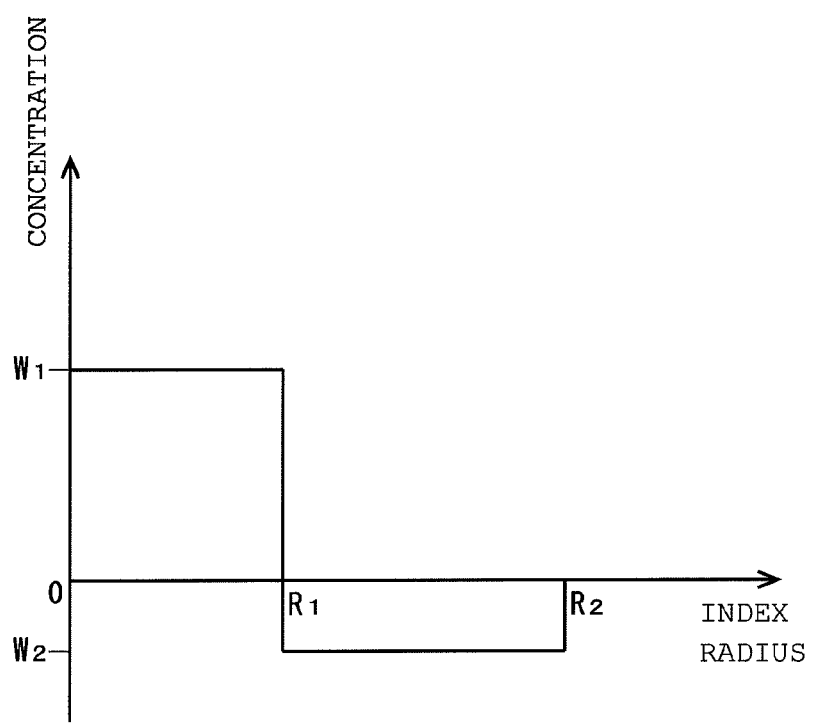
FIG. 6 is a graph for explaining a rule for the designing process in FIG. 4.

For each cell, whether or not to change the state is determined (STEP 4). This determination is performed according to a rule. FIG. 6 is a graph for explaining the rule. In the graph, the vertical axis indicates a concentration, and the horizontal axis indicates an index radius. The index radius is a value obtained by dividing a distance from the cell by a reference value. The reference value is the distance between the cell and a cell closest to the cell. A first concentration $W_1$ is positive, and a second concentration $W_2$ is negative. The absolute value of the first concentration $W_1$ is greater than the absolute value of the second concentration $W_2$. An index radius $R_2$ is greater than an index radius $R_1$. In the area where the index radius is greater than 0 and equal to or less than $R_1$, the concentration is $W_1$. In the area where the index radius is greater than $R_1$ and equal to or less than $R_2$, the concentration is $W_2$.

Figure 7:
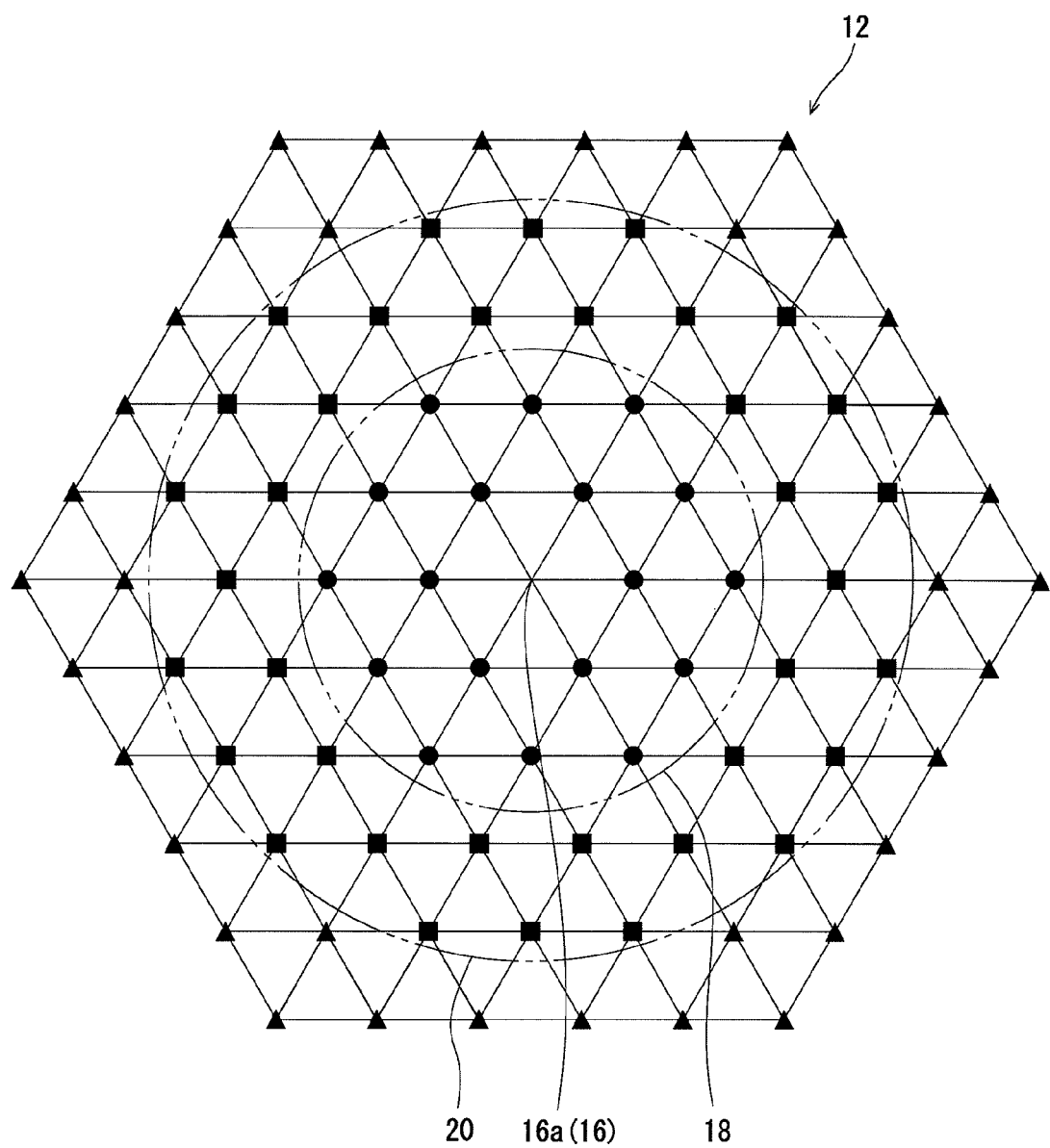
FIG. 7 is a partially enlarged view of the mesh in FIG. 5.

FIG. 7 is a partially enlarged view of the mesh 12 in FIG. 5. For convenience's sake, in FIG. 7, the mesh 12 is two-dimensionally drawn. At the center in FIG. 7, a cell 16a, which is an object for which the determination is performed, is shown. Further, in FIG. 7, a first circle 18 and a second circle 20 are shown. The first circle 18 has a center at the cell 16a and an index radius of $R_1$. The second circle 20 has a center at the cell 16a and an index radius of $R_2$. What are indicated by filled circles are cells 16 included in the first circle 18 other than the cell 16a. What are indicated by filled squares are cells 16 that are included in the second circle 20 and not included in the first circle 18. What are indicated by filled triangles are cells 16 that are not included in the second circle 20.

In the designing process, the number $N_{R1}$ of cells 16 in a specific state which are included in the first circle 18 and not located at the center of the first circle 18, is counted. In a preferred embodiment, the number of cells 16 whose states are differentiated is counted to obtain the total number $N_{R1}$. Further, in the designing process, the number $N_{R1-R2}$ of cells 16 in a specific state which are included in the second circle 20 and not included in the first circle 18, is counted. In a preferred embodiment, the number of cells 16 whose states are differentiated is counted to obtain the total number $N_{R1\text{-}R2}$. The numbers $N_{R1}$ and $N_{R1\text{-}R2}$ are substituted into the following mathematical formula (1) to obtain a value E. Based on the value E, whether or not to change the state of the cell 16*a* is determined.

$$E = W_1 * N_{R1} + W_2 * N_{R1\text{-}R2} \quad (1)$$

Based on the determination, the state of the cell 16*a* is updated (STEP 5). In the update, the state of the cell 16*a* may change or may not change. In a preferred embodiment, when the value E is positive, the state of the cell 16*a* is maintained if the state of the cell 16*a* is differentiated, and the state of the cell 16*a* is changed to be differentiated if the state of the cell 16*a* is undifferentiated. When the value E is zero, the state of the cell 16*a* is maintained. When the value E is negative, the state of the cell 16*a* is changed to be undifferentiated if the state of the cell 16*a* is differentiated, and the state of the cell 16*a* is maintained if the state of the cell 16*a* is undifferentiated. The mesh 12 in which the update for the first time is completed for all the cells 16 is at stage 2.

The following will describe a calculation example for the determination and the update.
Conditions
  First concentration $W_1$: 1.00
  Second concentration $W_2$: −0.60
  Number of cells 16 which are included in the first circle 18 and whose states are differentiated (except for the cell 16*a*): 8
  Number of cells 16 which are included in the second circle 20 and not included in the first circle 18 and whose states are differentiated: 13
Calculation Example $$E = 1.00 * 8 - 0.60 * 13$$
$$= 0.2$$

In this case, because the value E is positive, the state of the cell 16*a* is maintained if the state of the cell 16*a* is differentiated, and the state of the cell 16*a* is changed to be differentiated if the state of the cell 16*a* is undifferentiated.

The following will describe another calculation example for the determination and the update.
Conditions
  First concentration $W_1$: 1.00
  Second concentration $W_2$: −0.60
  Number of cells 16 which are included in the first circle 18 and whose states are differentiated (except for the cell 16*a*): 5
  Number of cells 16 which are included in the second circle 20 and not included in the first circle 18 and whose states are differentiated: 9
Calculation Example $$E = 1.00 * 5 - 0.60 * 9$$
$$= -0.4$$

In this case, because the value E is negative, the state of the cell 16*a* is changed to be undifferentiated if the state of the cell 16*a* is differentiated, and the state of the cell 16*a* is maintained if the state of the cell 16*a* is undifferentiated.

The determination and the update are repeated. The number of times of the repetition is M in the flowchart in FIG. 4. The mesh 12 after the repetition of M times is completed is at stage (M+1). As a stage proceeds, the number of cells 16 whose states change by update decreases. At a stage with a small number of times of the repetition, the change in pattern by update is great. By update being performed a large number of times, the pattern converges. The number of times of the repetition is preferably equal to or greater than 3 and more preferably equal to or greater than 5. If the number of times of the repetition is excessive, a load on the computer is great. In this respect, the number of times of the repetition is preferably equal to or less than 30 and more preferably equal to or less than 10.

Figure 8:
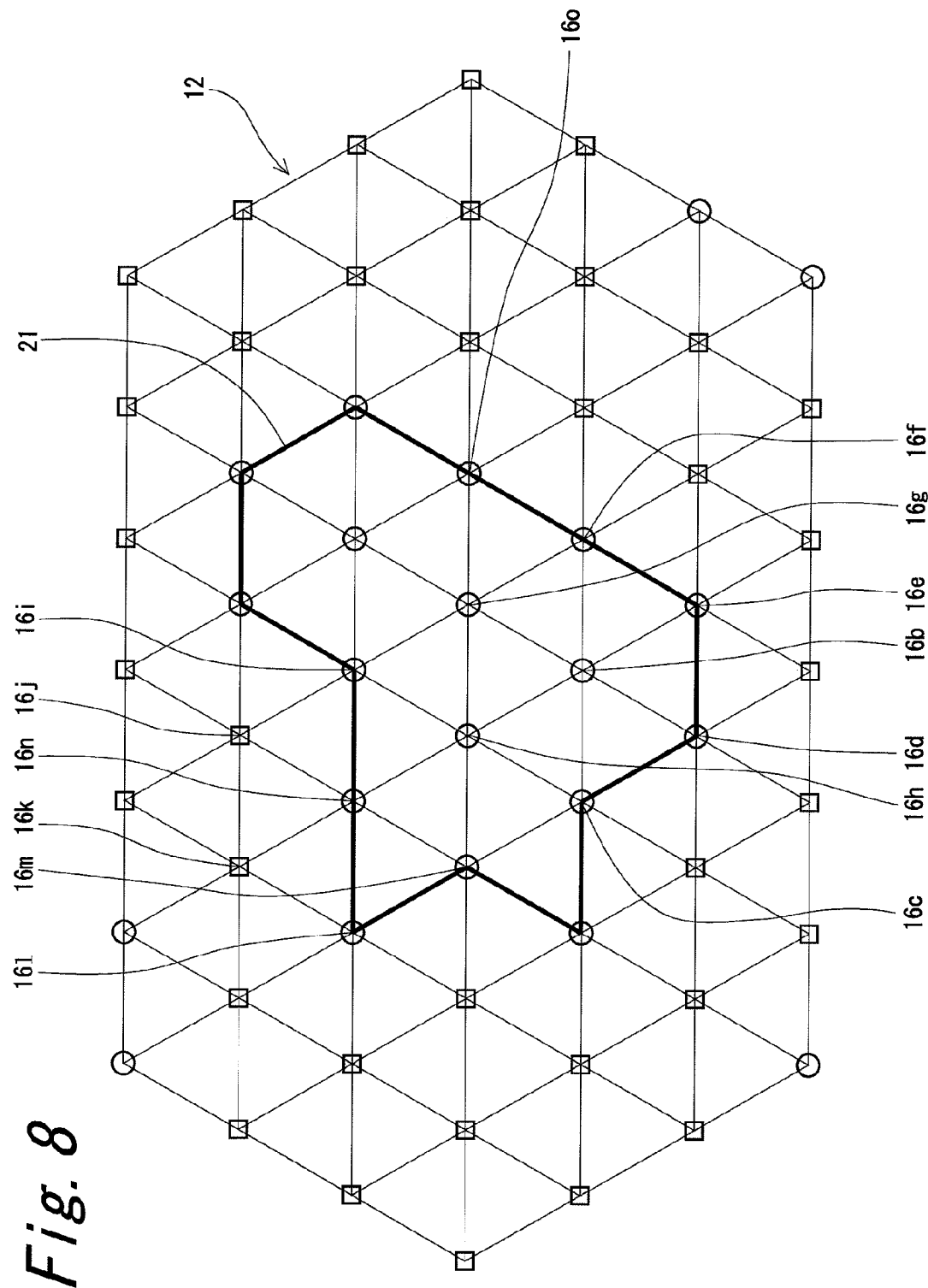
FIG. 8 is a partially enlarged view of the mesh after update is completed.

The determination and the update are repeated M times to fix the state of each cell 16. This fixing is "to assign a state" to the cell 16. FIG. 8 is a partially enlarged view of the mesh 12 after assignment of state is completed. In FIG. 8, what are indicated by circles are differentiated cells 16, and what are indicated by squares are undifferentiated cells 16. Based on this state, an iflag is assigned to cells 16. First, "0" is provisionally assigned as an iflag to all the cells 16. Next, the iflags of the differentiated cells 16 are changed. The cell 16 indicated by a reference sign 16*b* in FIG. 8 is adjacent to six cells 16*c*-16*h*. In the present invention, when a triangle with one cell 16 at one vertex thereof has another cell 16 at another vertex thereof, this state is referred to as where "the one cell 16 is adjacent to the other cell 16". The states of the cells 16*c*-16*h* are differentiated. When the states of all the cells 16*c*-16*h* adjacent to the cell 16*b* are differentiated, the iflag of the cell 16*b* is changed from "0" to "1". The cell 16 indicated by a reference sign 16*n* in FIG. 8 is adjacent to six cells 16*h*-16*m*. The states of the cells 16*h*, 16*i*, 16*l*, and 16*m* are differentiated. The states of the cells 16*j* and 16*k* are undifferentiated. When the cell 16*n* is adjacent to one or more cells 16 whose states are undifferentiated, the iflag of the cell 16*n* is changed from "0" to "2". The iflags of all cells 16 whose states are differentiated are changed. The iflags of cells 16 whose states are undifferentiated are not changed. Based on the iflags, attributes are assigned to all the cells 16 (STEP 6). The assignment of attribute is performed based on the following rule.
  iflag: 0 attribute: OUTSIDE
  iflag: 1 attribute: INSIDE
  iflag: 2 attribute: BOUNDARY
The mesh 12 in which the assignment of attribute is completed is at first phase. By connecting a plurality of cells 16 whose attributes are BOUNDARY, a first loop 21 is completed. In FIG. 8, the first loop 21 is shown by a thick line.

Figure 9:
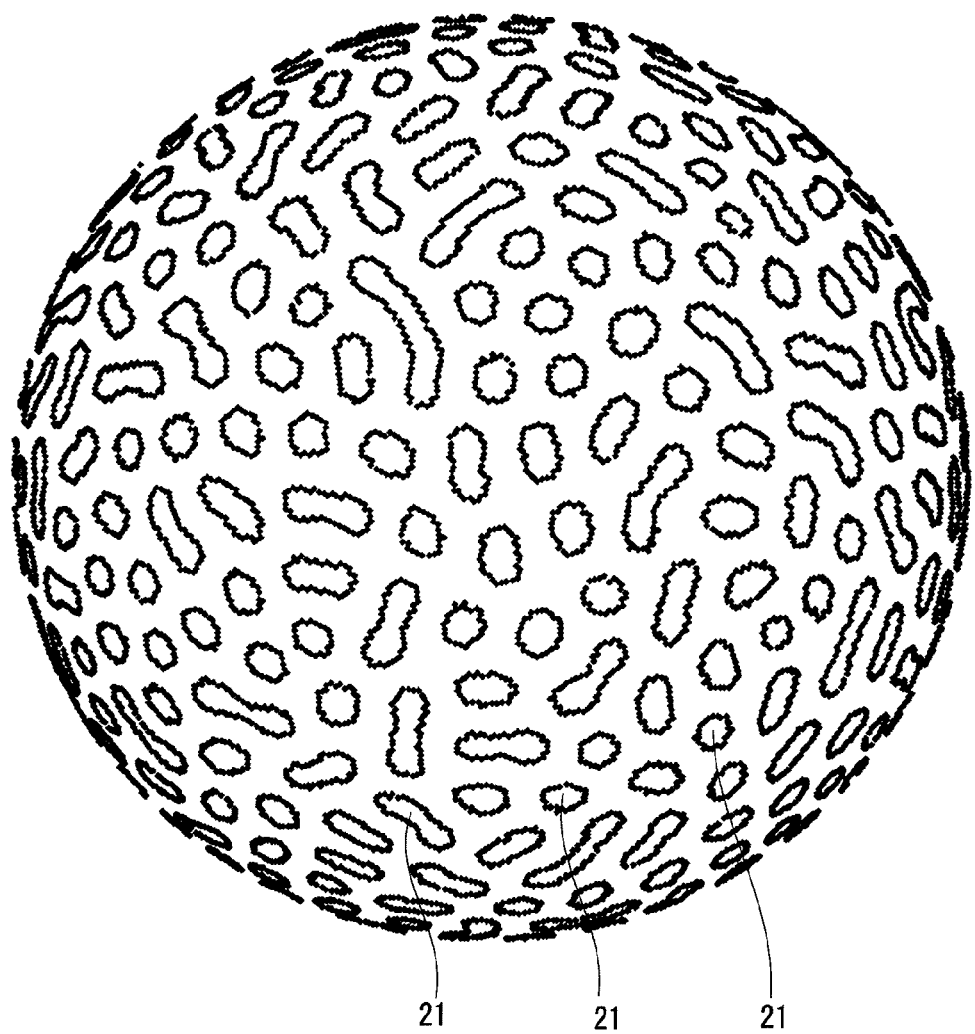
FIG. 9 is a front view of a pattern having first loops.

A pattern having a large number of first loops 21 is shown in FIG. 9. The pattern is obtained by using the following parameters.
  W1: 1.0
  W2: −0.6
  R1: 4.5
  R2: 8.0

An occupation ratio of the pattern is calculated (STEP 7). In this calculation, the area surrounded by each first loop 21 is calculated. The areas of all the first loops 21 are summed. The ratio of the sum to the surface area of the phantom sphere 14 is the occupation ratio. The occupation ratio may be approximately calculated by using a large number of triangles shown in FIG. 5. In the approximate calculation, the sum of the areas of triangles included in the first loops 21 is divided by the sum of the areas of all the triangles.

Based on the obtained occupation ratio, a determination is performed (STEP 8). At this STEP, it is determined whether or not the occupation ratio is equal to or greater than a predetermined value. In the embodiment shown in FIG. 4, it is determined whether or not an occupation ratio Y is equal to or greater than 65%.

Figure 10:
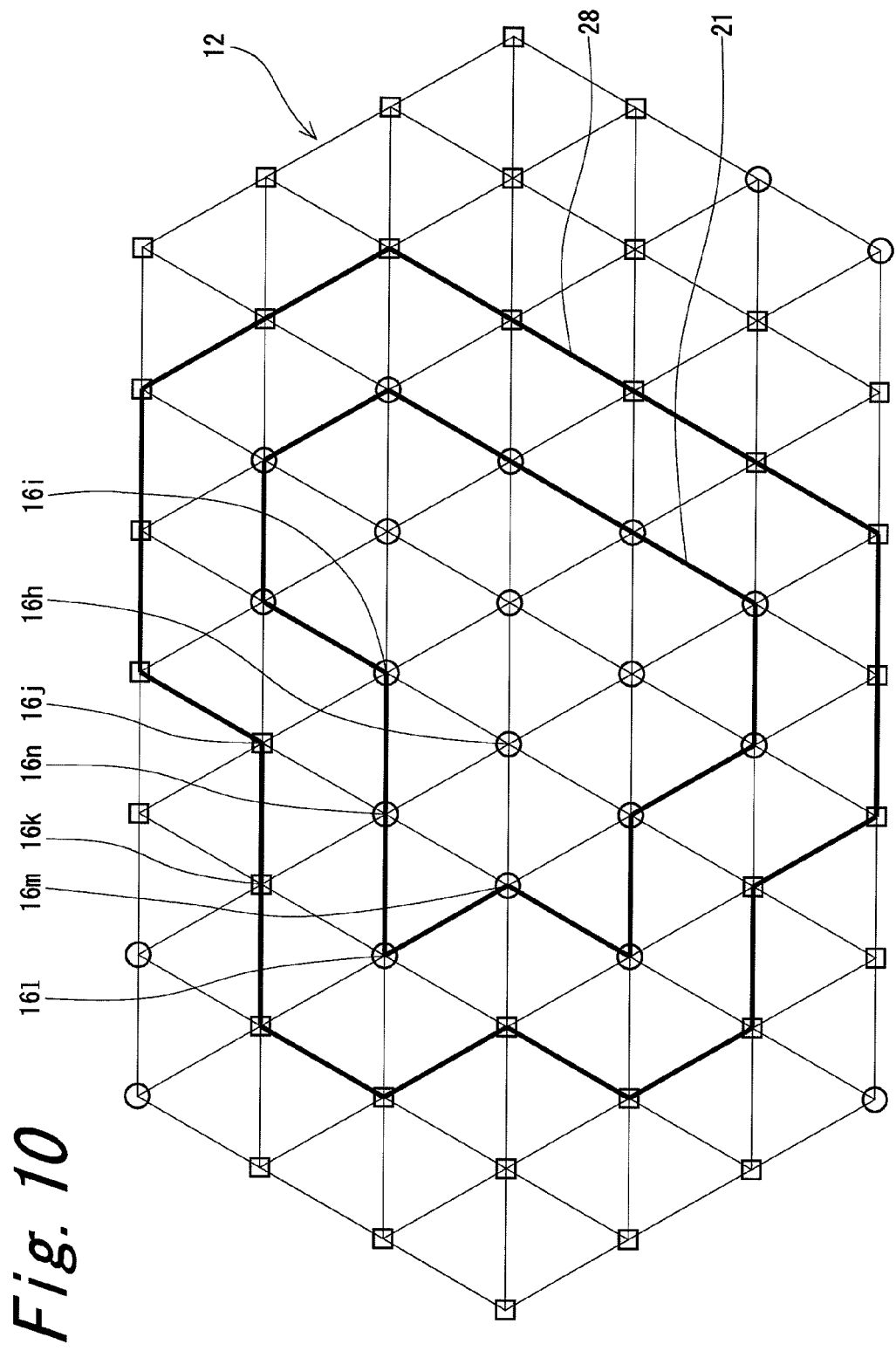
FIG. 10 is a partially enlarged view of the mesh after assignment of attribute is completed.

When the occupation ratio Y is less than 65%, update of attribute is performed (STEP 9). The following will describe a method of this update in detail. FIG. 10 is a partially enlarged view of the mesh 12 after assignment of attribute is completed. The cell 16 indicated by the reference sign 16*n* is present on the first loop 21. The cell 16*n* is adjacent to six cells 16*h* to 16*m*. The iflag of the cell 16*h* is "1" and its attribute is INSIDE. The iflag of a cell 16 whose attribute is INSIDE is not changed. The iflags of the cells 16*i*, 16*l*, and 16*m* are "2", and their attributes are BOUNDARY. The iflag of a cell 16 whose attribute is BOUNDARY and which is adjacent to another cell 16 whose attribute is BOUNDARY is not changed. The iflags of the cells 16*j* and 16*k* are "0", and their attributes are OUTSIDE. The iflag of a cell 16 whose attribute is OUTSIDE and which is adjacent to another cell 16 whose attribute is BOUNDARY is changed from "0" to "3". The iflags of cells 16 adjacent to all the cells 16 present on the first loop 21 are decided. Based on the iflags, the update of attribute is performed (STEP 9). The update of attribute is performed based on the following rule.
  iflag: 0 attribute: OUTSIDE
  iflag: 1-2 attribute: INSIDE
  iflag: 3 attribute: BOUNDARY
The mesh 12 in which the update of attribute has been performed once is at second phase.

By connecting a plurality of cells 16 whose attributes are BOUNDARY, a second loop 28 is obtained. The second loop 28 has an area larger than the area of the first loop 21. In other words, the occupation ratio becomes great due to the update of attribute (STEP 9).

Figure 11:
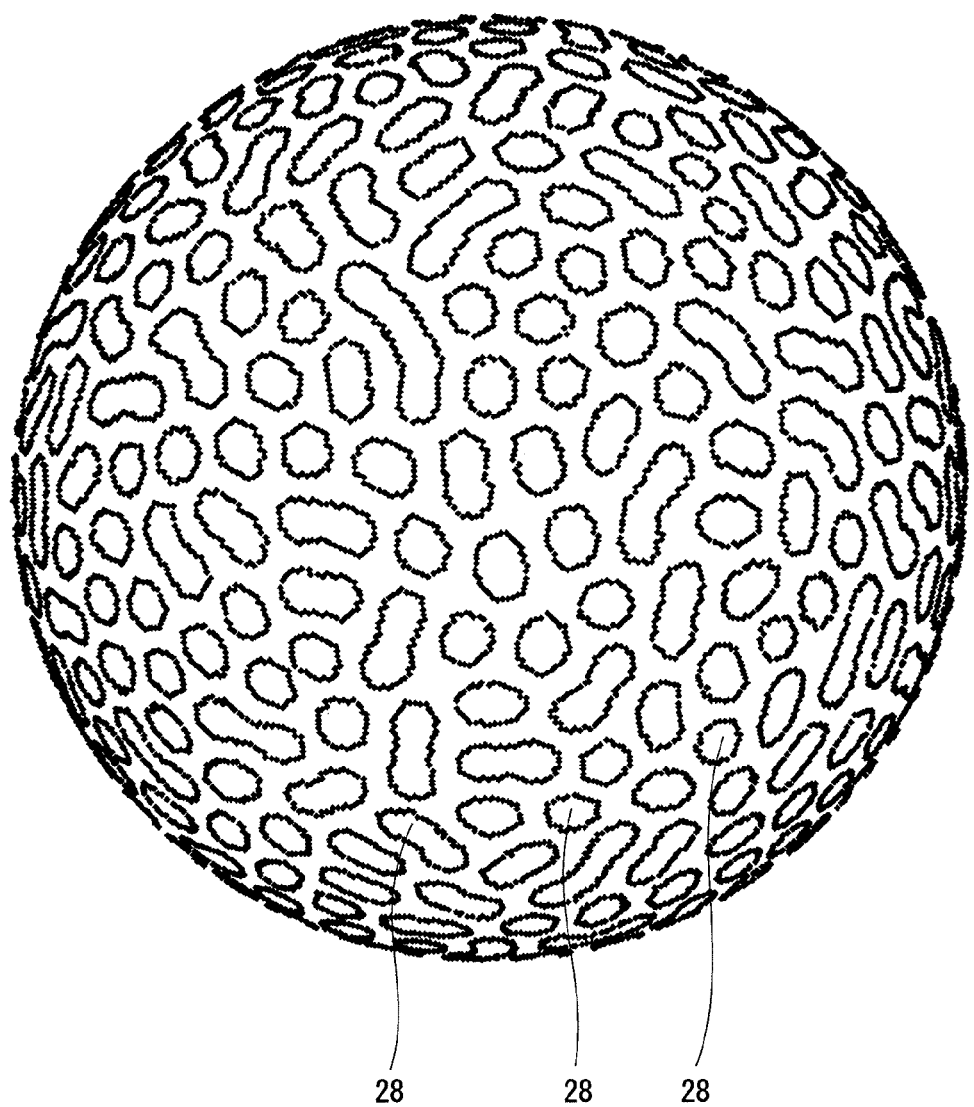
FIG. 11 is a front view of a pattern having second loops.

A pattern having a large number of second loops 28 is shown in FIG. 11. As is obvious from the comparison of FIGS. 9 and 11, the occupation ratio of the pattern in FIG. 11 is greater than that in FIG. 9. The occupation ratio of this pattern is calculated (STEP 7). Based on the obtained occupation ratio, the determination is performed (STEP 8). At this STEP, it is determined whether or not the occupation ratio is equal to or greater than the predetermined value. In the embodiment shown in FIG. 4, it is determined whether or not the occupation ratio Y is equal to or greater than 65%. Thereafter, similarly, the update of attribute (STEP 9), the calculation of occupation ratio (STEP 7), and the determination (STEP 8) are repeated until the occupation ratio Y becomes equal to or greater than 65%. Prior to the update of attribute for the Nth time, the iflag of a cell 16 whose attribute is OUTSIDE and which is adjacent to another cell 16 whose attribute is BOUNDARY is changed from "0" to "N+2". The update of attribute for the Nth time is performed based on the following rule.
  iflag: 0 attribute: OUTSIDE
  iflag: 1 to N+1 attribute: INSIDE
  iflag: N+2 attribute: BOUNDARY
The mesh 12 in which the update of attribute has been performed N times is at (N+1)th phase.

Figure 12:
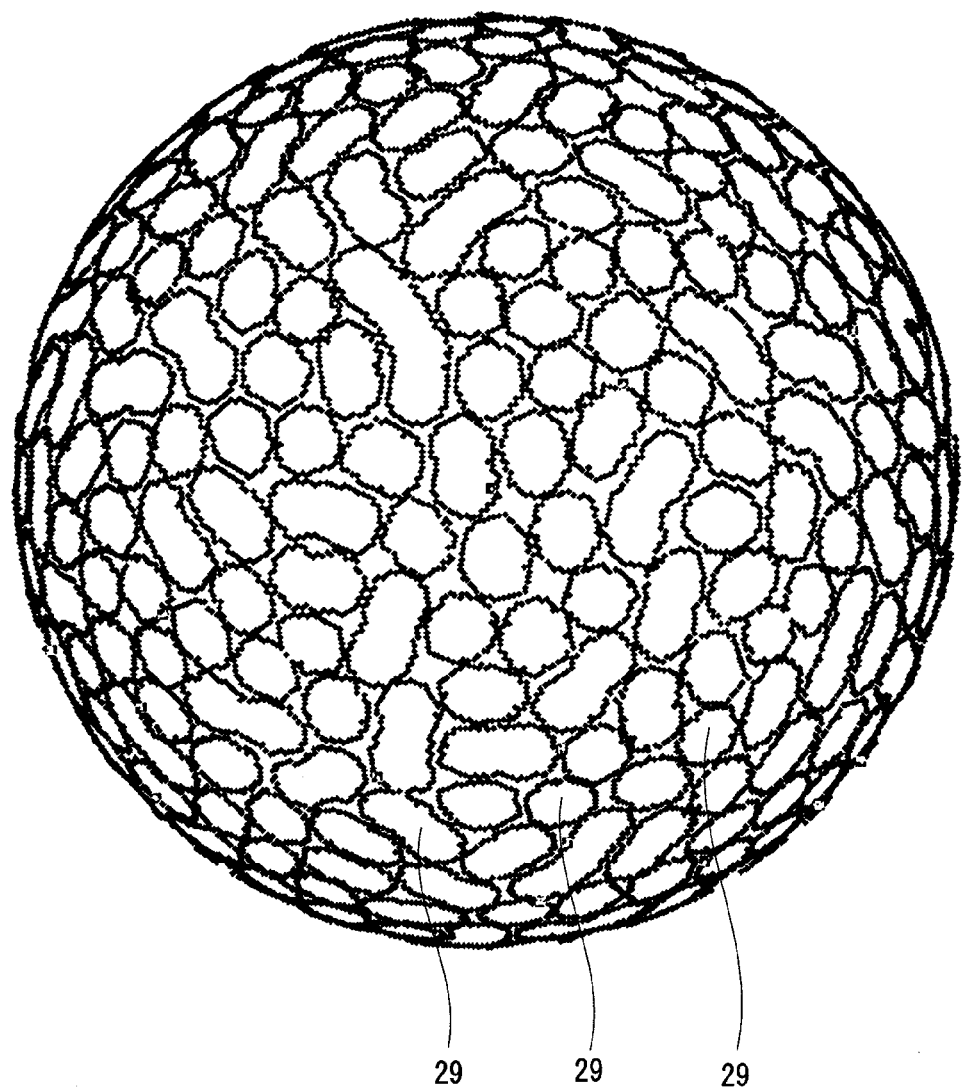
FIG. 12 is a front view of a pattern having third loops.

A pattern obtained by performing the update of attribute twice is shown in FIG. 12. The mesh 12 having this pattern is at third phase. The pattern has a large number of third loops 29. Each third loop 29 has an area larger than the area of the second loop 28. As is obvious from the comparison of FIGS. 9, 11, and 12, the occupation ratio of the pattern shown in FIG. 12 is great. The occupation ratio of the pattern is 79%.

Figure 13:
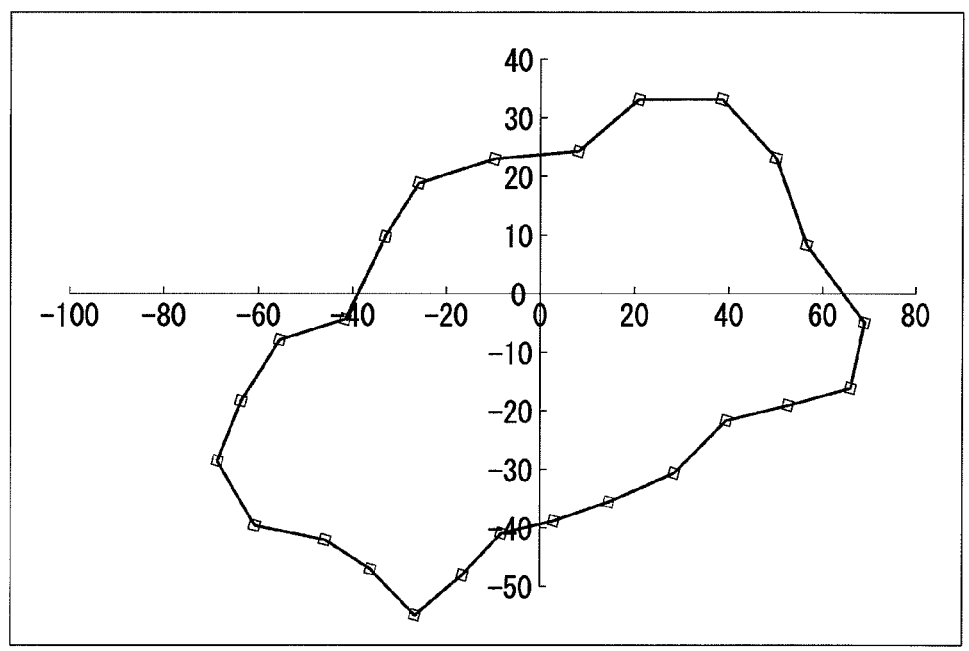
FIG. 13 is a front view of a third loop.

FIG. 13 shows one third loop 29. The third loop 29 is obtained by connecting twenty-five cells 16 whose attributes are BOUNDARY. The third loop 29 has a large number of vertices.

Figure 14:
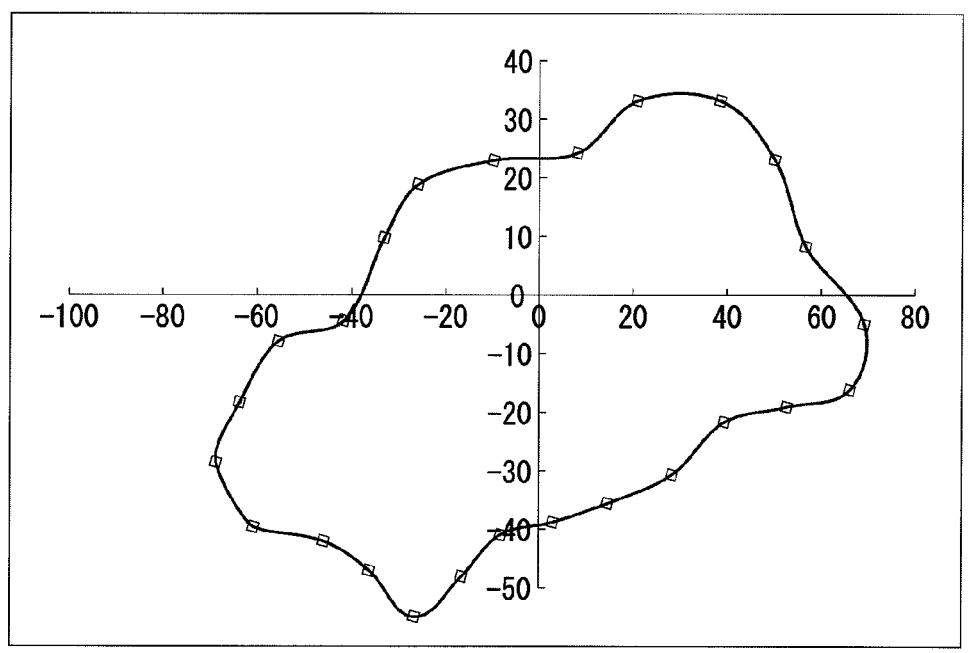
FIG. 14 is a front view of a loop obtained by connecting cells of the third loop in FIG. 13 by a spline curve.

In FIG. 14, the twenty-five cells 16 are connected by a spline curve. The spline curve is a smooth curve that passes through a plurality of points. For the spline curve, a line between adjacent two cells 16 is defined by a polynomial equation. In general, a third-order polynomial equation is used. As is obvious from the comparison of FIGS. 13 and 14, a smooth loop is obtained by using the spline curve.

Preferably, smoothing is performed on coordinates of the cells 16 on the loop, to obtain reference points corresponding to the cells 16 (STEP 10). By connecting a large number of the reference points by a spline curve, a new loop is assumed (STEP 11).

Figure 15:
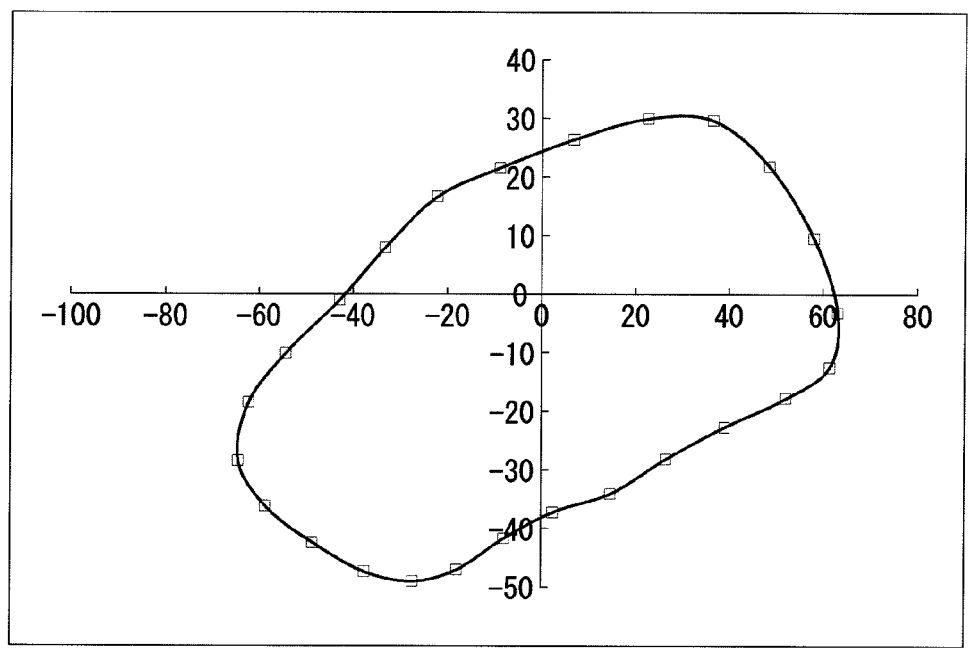
FIG. 15 is a front view of a loop obtained by connecting, by a spline curve, reference points obtained by three-point moving averaging.
Figure 16:
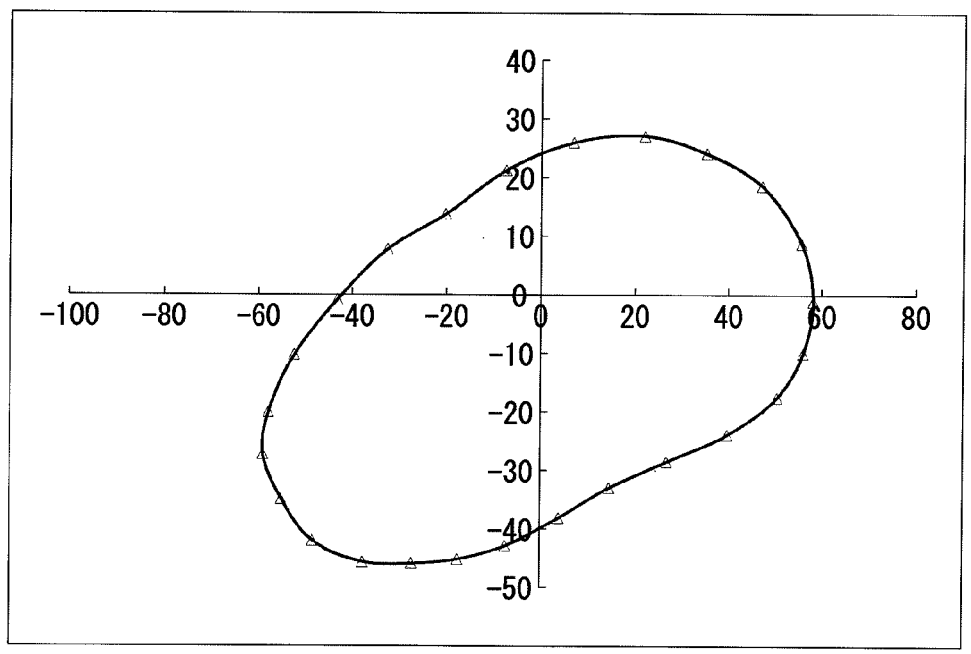
FIG. 16 is a front view of a loop obtained by connecting, by a spline curve, reference points obtained by five-point moving averaging.
Figure 17:
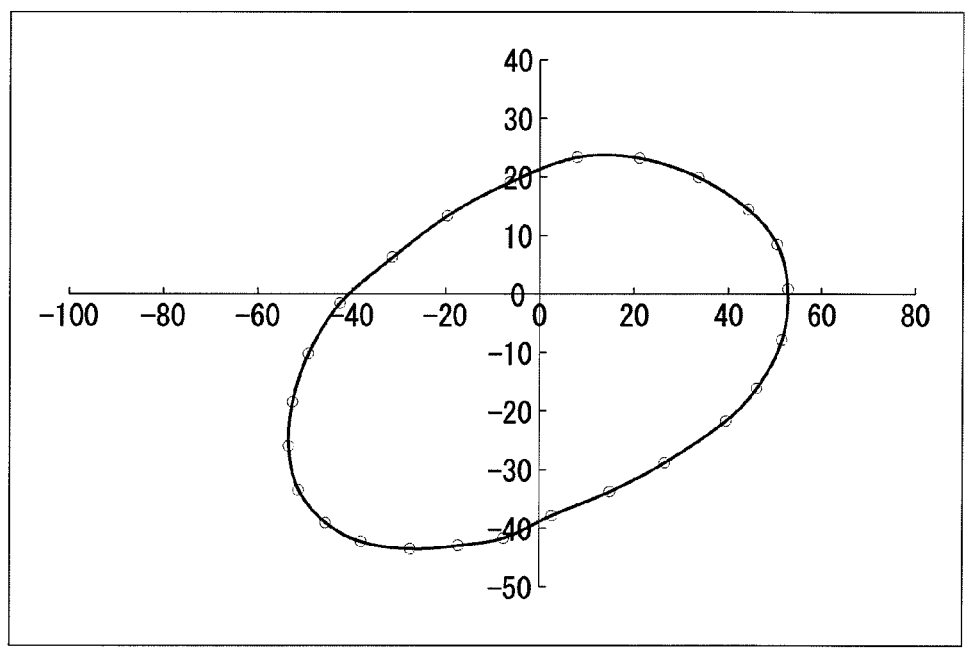
FIG. 17 is a front view of a loop obtained by connecting, by a spline curve, reference points obtained by seven-point moving averaging.

Typical smoothing is moving averaging. FIG. 15 shows a loop obtained by connecting, by a spline curve, reference points obtained by three-point moving averaging. FIG. 16 shows a loop obtained by connecting, by a spline curve, reference points obtained by five-point moving averaging. FIG. 17 shows a loop obtained by connecting, by a spline curve, reference points obtained by seven-point moving averaging. As is obvious from the comparison of FIGS. 14 to 17, smoothing of a contour can be achieved by moving averaging.

In the three-point moving averaging, coordinates of the following three cells 16 are averaged:
  (1) a cell 16;
  (2) a cell 16 that is closest to the cell 16 in the clockwise direction of the loop; and
  (3) a cell 16 that is closest to the cell 16 in the counterclockwise direction of the loop.

In the five-point moving averaging, coordinates of the following five cells 16 are averaged:
  (1) a cell 16;
  (2) a cell 16 that is closest to the cell 16 in the clockwise direction of the loop;
  (3) a cell 16 that is closest to the cell 16 in the counterclockwise direction of the loop;
  (4) a cell 16 that is second closest to the cell 16 in the clockwise direction of the loop; and
  (5) a cell 16 that is second closest to the cell 16 in the counterclockwise direction of the loop.

In the seven-point moving averaging, coordinates of the following seven cells 16 are averaged:
  (1) a cell 16;
  (2) a cell 16 that is closest to the cell 16 in the clockwise direction of the loop;
  (3) a cell 16 that is closest to the cell 16 in the counterclockwise direction of the loop;
  (4) a cell 16 that is second closest to the cell 16 in the clockwise direction of the loop;
  (5) a cell 16 that is second closest to the cell 16 in the counterclockwise direction of the loop;
  (6) a cell 16 that is third closest to the cell 16 in the clockwise direction of the loop;
  (7) a cell 16 that is third closest to the cell 16 in the counterclockwise direction of the loop.

Figure 18:
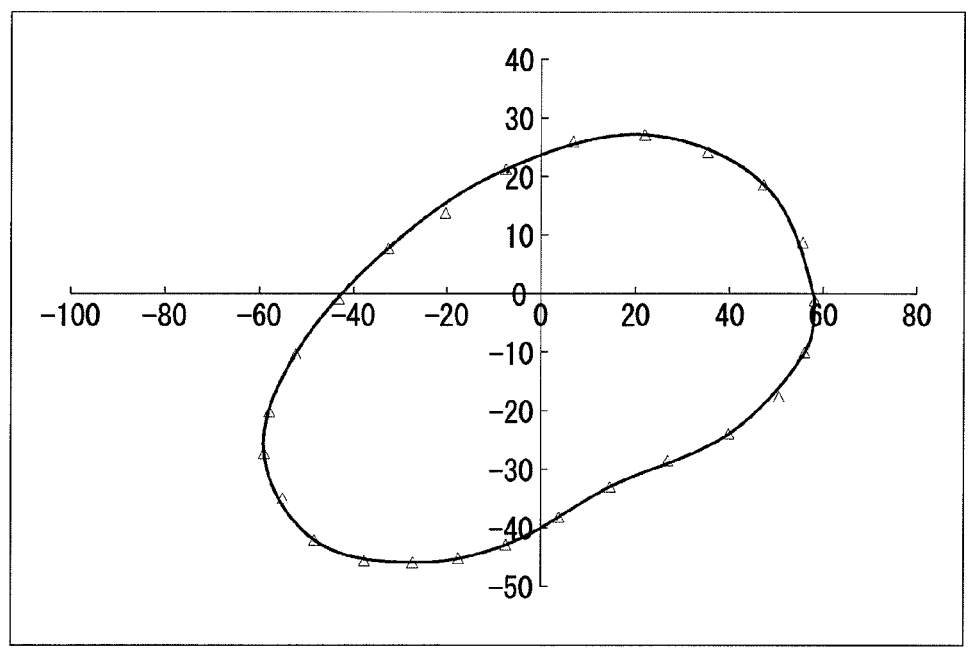
FIG. 18 is a front view of a loop obtained as a result of thinning out the reference points obtained by the five-point moving averaging, into half.
Figure 19:
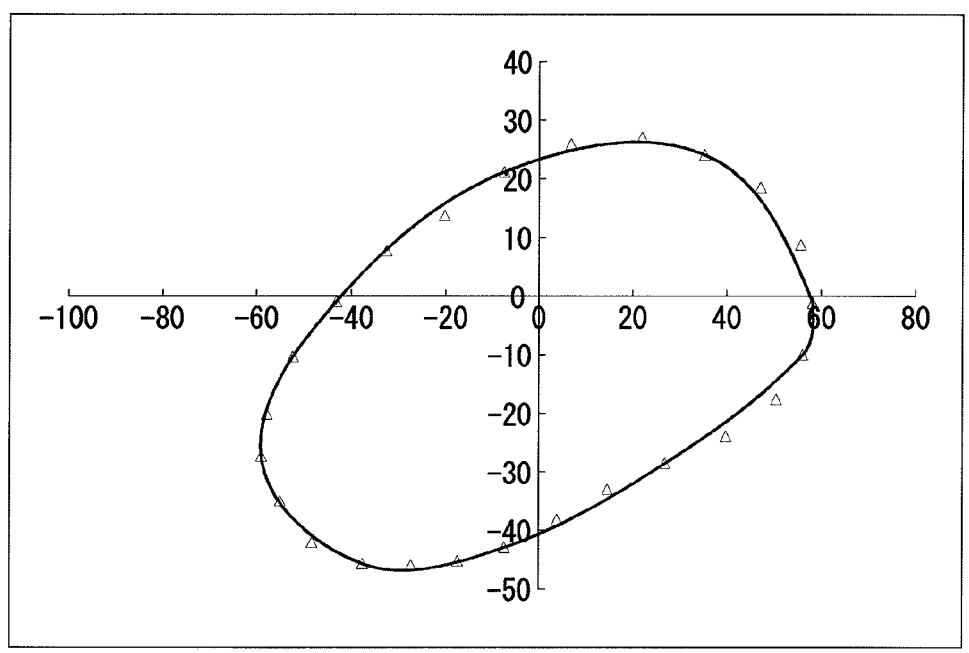
FIG. 19 is a front view of a loop obtained as a result of thinning out the reference points obtained by the five-point moving averaging, into ⅓.
Figure 20:
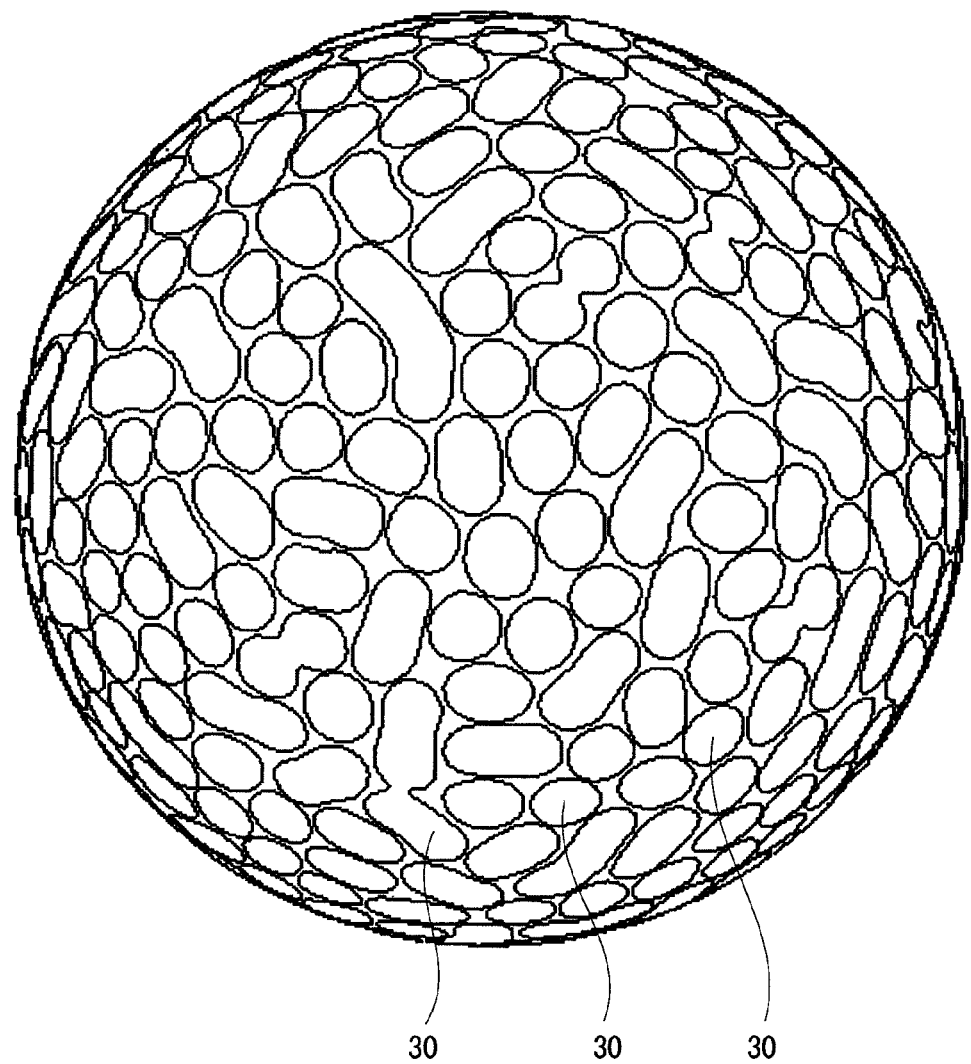
FIG. 20 is a front view of a pattern having the loop in FIG. 19.
Figure 21:
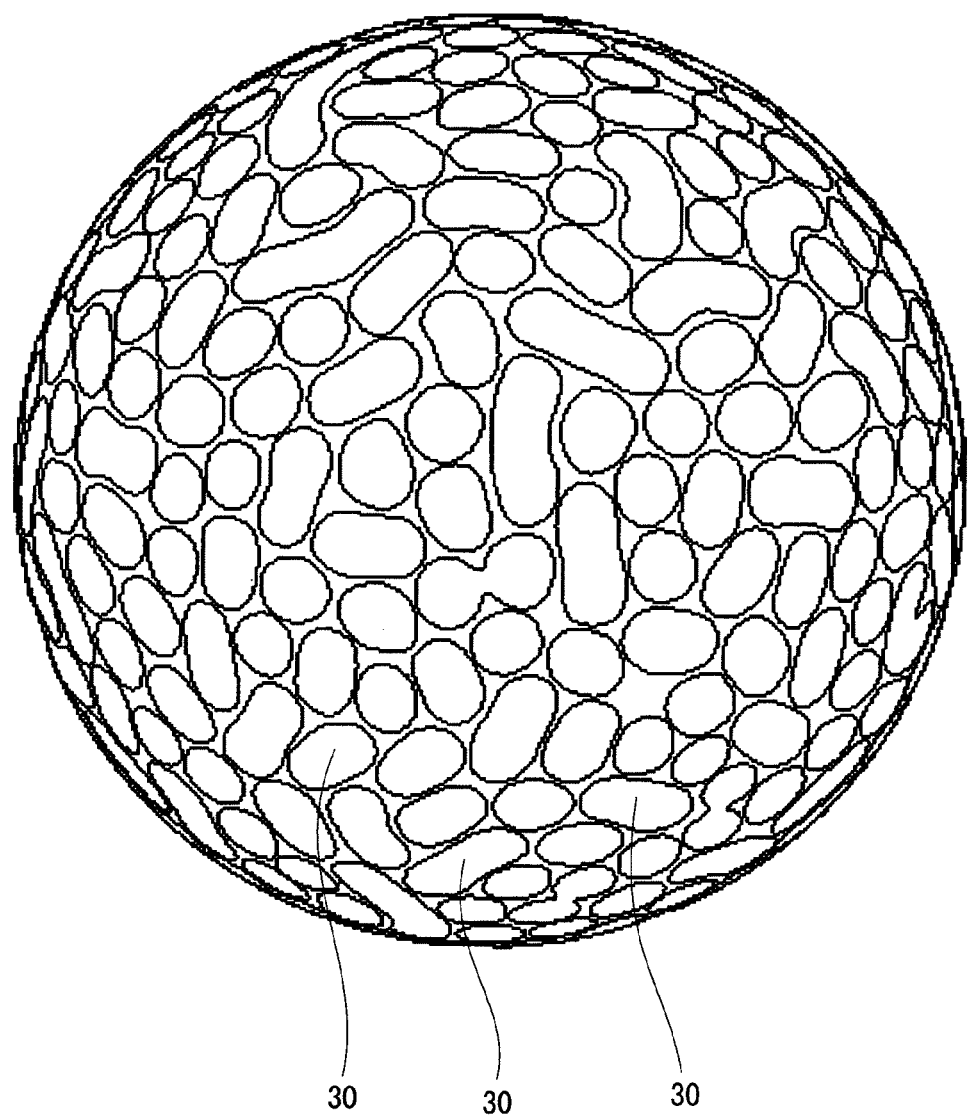
FIG. 21 is a plan view of the pattern in FIG. 20.

When forming a loop, a part of the reference points may be removed, and a spline curve may be drawn. FIG. 18 shows a loop obtained by thinning out the reference points obtained by the five-point moving averaging, into half (one-point skipping). FIG. 19 shows a loop obtained by thinning out the reference points obtained by the five-point moving averaging, into ⅓ (two-point skipping). FIGS. 20 and 21 show a pattern having the loop shown in FIG. 19. The pattern has a large number of loops 30. The loops 30 are randomly arranged on the surface of the phantom sphere 14.

Figure 22:
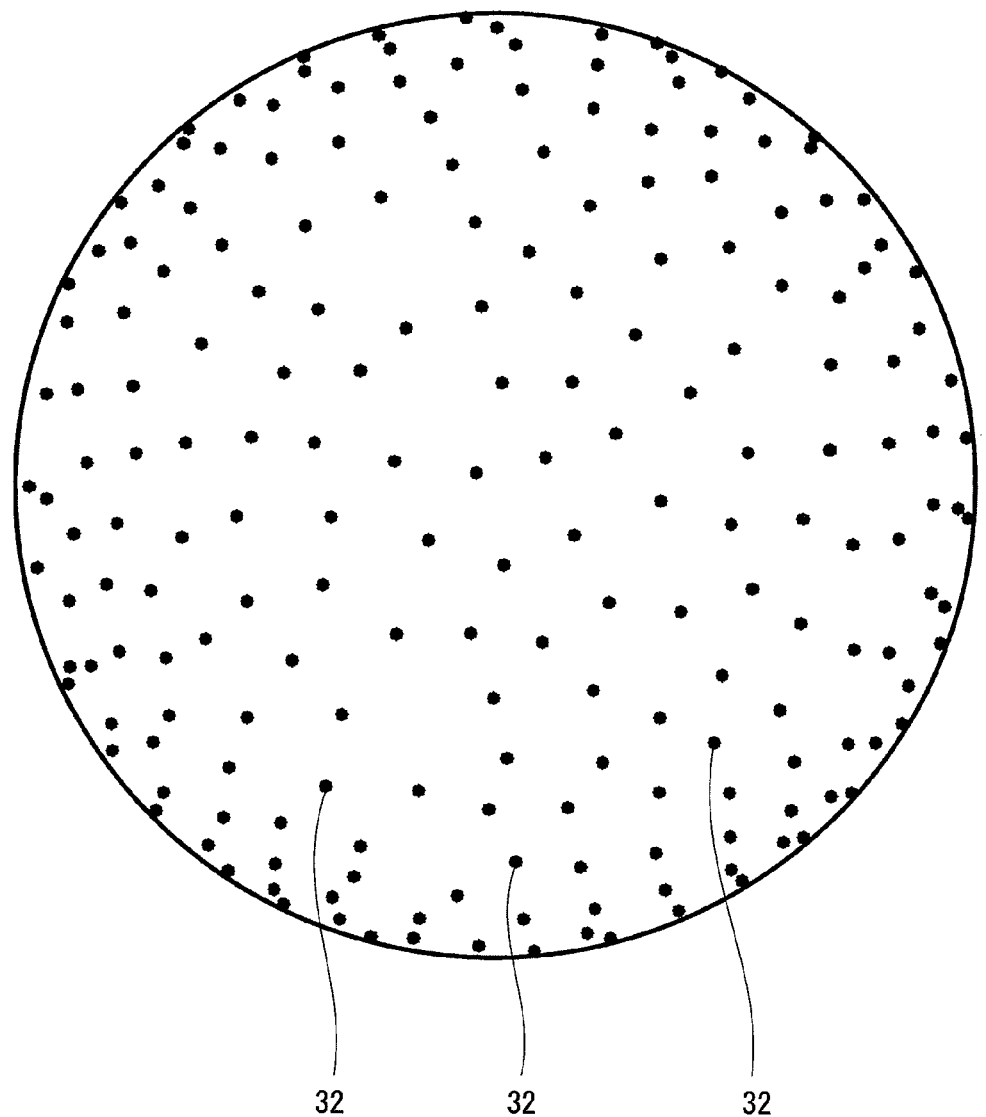
FIG. 22 is a front view showing a large number of generating points.

Based on the pattern of the loops 30 shown in FIGS. 20 and 21, a dimple pattern is obtained by the Voronoi tessellation. In the Voronoi tessellation, the central point of each loop 30 is obtained. A coordinate of the central point is obtained by calculating the average of coordinates of: cells on the contour of the loop 30; and cells present inside the contour. The coordinate of the central point may be obtained by calculating the average of the coordinates of only the cells present inside the contour of the loop 30. The coordinate of the central point may be obtained by calculating the average of the coordinates of only the cells present on the contour of the loop 30. Hereinafter, the central point is referred to as a generating point. FIG. 22 shows a large number of generating points 32. Since the loops 30 are randomly arranged, the generating points 32 are also randomly arranged on the surface of the phantom sphere 14.

Based on the first loops 21 shown in FIG. 9, generating points 32 may be decided. In this case as well, a large number of the generating points 32 arranged randomly are obtained. Based on the second loops 28 shown in FIG. 11, generating points 32 may be decided. In this case as well, a large number of the generating points 32 arranged randomly are obtained. Based on the third loops 29 shown in FIG. 12, generating points 32 may be decided. In this case as well, a large number of the generating points 32 arranged randomly are obtained. Based on loops obtained by connecting the cells 16 by spline curves (see FIG. 14), generating points 32 may be decided. In this case as well, a large number of the generating points 32 arranged randomly are obtained. Based on loops obtained by performing the smoothing (see FIGS. 15 to 17), generating points 32 may be decided. In this case as well, a large number of the generating points 32 arranged randomly are obtained.

Figure 23:
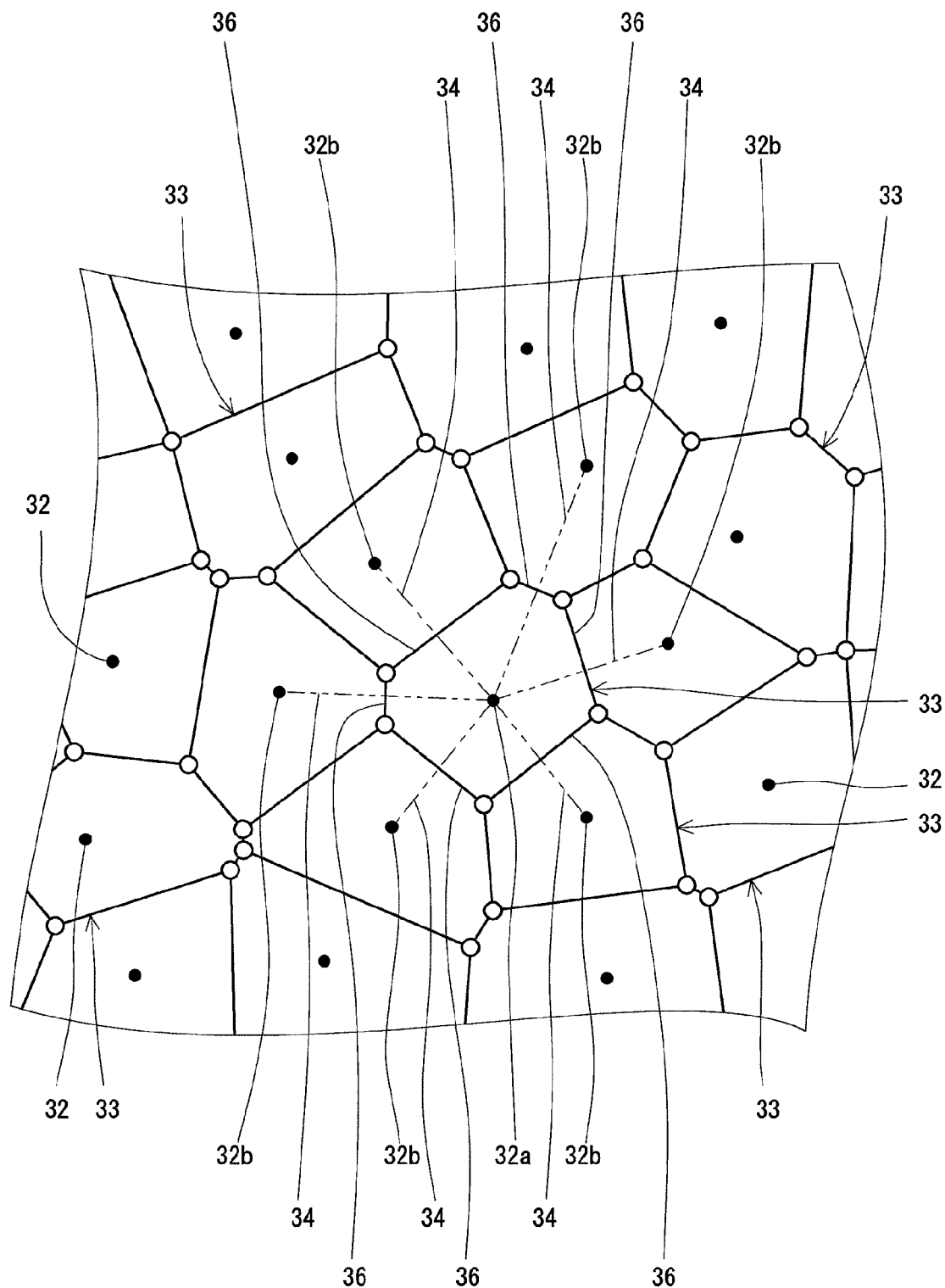
FIG. 23 is an enlarged view showing the generating points in FIG. 22 together with Voronoi regions.

Based on these generating points 32, a large number of Voronoi regions are assumed. FIG. 23 shows Voronoi regions 33. In FIG. 23, a generating point 32a is adjacent to six generating points 32b. What is indicated by each reference sign 34 is a line segment connecting the generating point 32a to the generating point 32b. FIG. 23 shows six line segments 34. What is indicated by each reference sign 36 is the perpendicular bisector of each line segment 34. The generating point 32a is surrounded by six perpendicular bisectors 36. What is indicated by each outline circle in FIG. 23 is the intersection point between a perpendicular bisector 36 and another perpendicular bisector 36. The intersection point is a vertex of a spherical polygon (e.g., a spherical hexagon). The spherical polygon is a Voronoi region 33. Each perpendicular bisector 36 is the boundary between a Voronoi region 33 and a Voronoi region 33 adjacent to this Voronoi region 33. The perpendicular bisector 36 defines the contour of the Voronoi region 33.

A land 10 is assigned to cells 16 adjacent to each perpendicular bisector 36. A dimple 8 is assigned to the other cells 16. By these assignments, a rugged pattern consisting of the land 10 and the dimples 8 is obtained. A dimple may be assigned to the cells 16 adjacent to each perpendicular bisector 36, and a land may be assigned to the other cells 16.

Calculation for defining the contour of the Voronoi region 33 based on the perpendicular bisectors 36 is complicated. The following will describe a method for simply obtaining Voronoi regions 33. In the method, distances between each cell 16 and all the generating points 32 are calculated. For each cell 16, distances of which the number is the same as the number of the generating points 32 are calculated. The shortest distance is selected from among these distances. The cell 16 is associated with the generating point 32 on which the shortest distance is based. In other words, the generating point 32 that is closest to the cell 16 is selected. It is noted that calculation of the distances between the cell 16 and the generating points 32 whose distances from the cell 16 are obviously large may be omitted.

Figure 24:
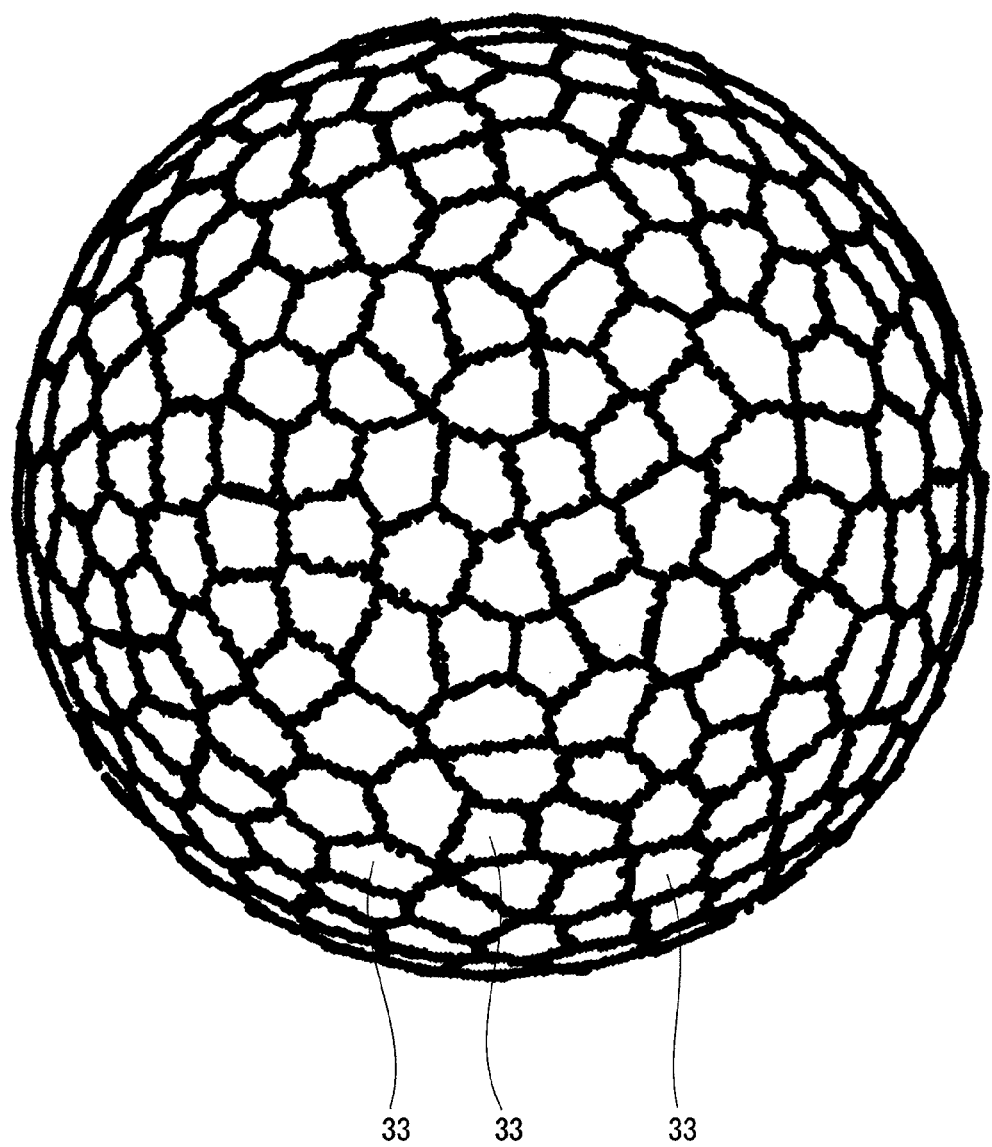
FIG. 24 is a front view showing Voronoi regions obtained by a simple method.

For each generating point 32, a set of cells 16 associated with the generating point 32 is assumed. In other words, a set of cells 16 for which this generating point 32 is the closest generating point 32 is assumed. The set is set as a Voronoi region 33. A large number of the Voronoi regions 33 obtained thus are shown in FIG. 24. In FIG. 24, when another cell 16 adjacent to a cell 16 belongs to a Voronoi region 33 different from a Voronoi region to which this cell 16 belongs, this cell 16 is filled with black.

As is obvious from FIG. 24, the contour of each Voronoi region 33 is a zigzag contour. The smoothing and thinning-out described above for the Cellular Automaton method are performed on the contour to draw a spline curve. By the spline curve, a loop is obtained. The loop may be enlarged or reduced in size to obtain a new loop. A land 10 is assigned to the outside of the loop. In other words, a land 10 is assigned to the vicinity of the contour of the Voronoi region 33. Meanwhile, a dimple 8 is assigned to the inside of the loop. In this manner, a rugged pattern shown in FIGS. 2 and 3 is obtained.

An example of a method for assigning a dimple 8 will be described. In the method, a deepest point is decided. Preferably, a deepest point is assumed on a line connecting the center of the loop to the center of the phantom sphere 14. A coordinate of the center of the loop is the average of coordinates of all reference points that define the loop. The deepest point is projected on the surface of the phantom sphere 14. A circular arc, which passes through the projected point and lies on the surface of the phantom sphere 14 and whose both ends lie on the loop, is assumed. A smooth curve, which passes through both ends of the circular arc and the deepest point and is convex inwardly in the radial direction of the golf ball 2, is assumed. Preferably, the smooth curve is a circular arc. The smooth curve and the loop are connected to each other by a smooth curved surface. Due to this, a dimple 8 is obtained. A dimple 8 may be obtained by connecting the deepest point to the loop by a smooth curved surface.

In the rugged pattern shown in FIGS. 2 and 3, a large number of the dimples 8 are randomly arranged. Each dimple 8 has a contour shape different from that of any of the other dimples 8. The golf ball 2 having the rugged pattern has excellent aerodynamic symmetry.

In light of suppression of rising of the golf ball 2 during flight, each dimple 8 has a depth of preferably 0.05 tumor greater, more preferably 0.08 mm or greater, and particularly preferably 0.10 mm or greater. In light of suppression of dropping of the golf ball 2 during flight, the depth is preferably equal to or less than 0.60 mm, more preferably equal to or less than 0.45 mm, and particularly preferably equal to or less than 0.40 mm. The depth is the distance between the deepest point of the dimple 8 and the surface of the phantom sphere 14.

In the present invention, the term "dimple volume" means the volume of a part surrounded by the surface of the phantom sphere 14 and the surface of the dimple 8. In light of suppression of rising of the golf ball 2 during flight, the sum of the volumes (total volume) of all the dimples 8 is preferably equal to or greater than 400 mm$^3$, more preferably equal to or greater than 450 mm$^3$, and particularly preferably equal to or greater than 500 mm$^3$. In light of suppression of dropping of the golf ball 2 during flight, the sum is preferably equal to or less than 750 mm³, more preferably equal to or less than 700 mm³, and particularly preferably equal to or less than 650 mm³.

In light of flight performance, the ratio (occupation ratio) of the sum of the areas of the dimples 8 to the surface area of the phantom sphere 14 is preferably equal to or greater than 65%, more preferably equal to or greater than 75%, and particularly preferably equal to or greater than 80%.

From the standpoint that a fundamental feature of the golf ball 2 being substantially a sphere is not impaired, the total number of the dimples 8 is preferably equal to or greater than 250 and particularly preferably equal to or greater than 300. From the standpoint that each dimple 8 exerts a sufficient dimple effect, the total number is preferably equal to or less than 450 and particularly preferably equal to or less than 400.

Preferably, the golf ball 2 has a difference dR whose absolute value is equal to or less than 0.50 mm. The absolute value is a parameter that correlates with the aerodynamic symmetry of the golf ball 2. The smaller the absolute value is, the smaller the difference between the trajectory during PH rotation and the trajectory during POP rotation is. In this respect, the absolute value is more preferably equal to or less than 0.45 mm and particularly preferably equal to or less than 0.40 mm. The following will describe an evaluation method based on the difference dR.

Figure 25:
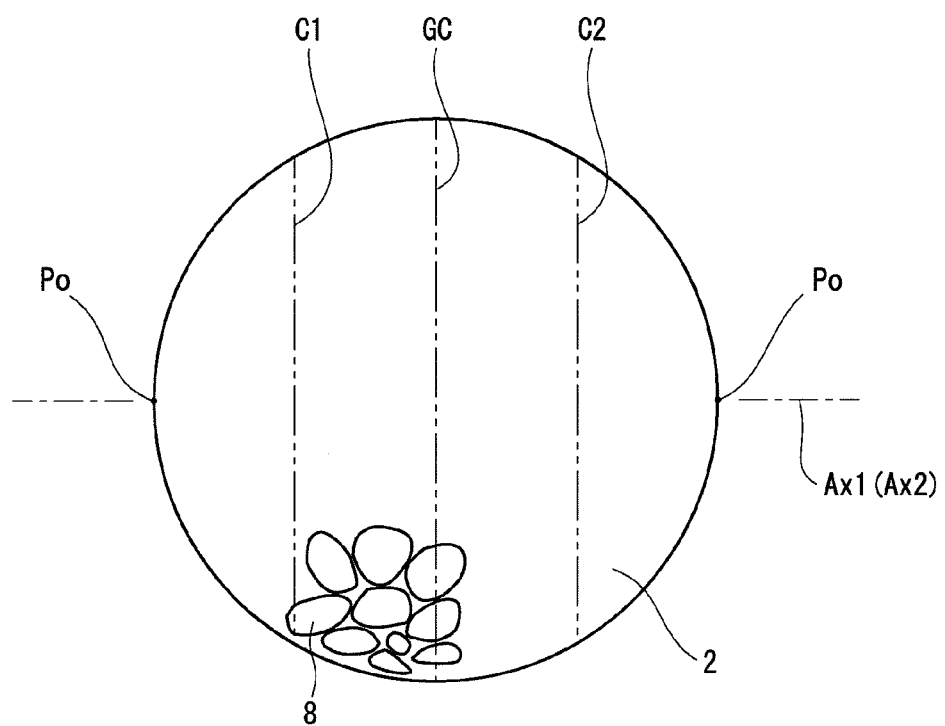
FIG. 25 is a schematic diagram for explaining a method for evaluating the golf ball in FIG. 2.

FIG. 25 is a schematic diagram for explaining the evaluation method. In the evaluation method, a first rotation axis Ax1 is assumed. The first rotation axis Ax1 passes through the two poles Po of the golf ball 2. Each pole Po corresponds to the deepest point of the mold used for forming the golf ball 2. One of the poles Po corresponds to the deepest point of an upper mold half, and the other pole Po corresponds to the deepest point of a lower mold half. The golf ball 2 rotates about the first rotation axis Ax1. This rotation is referred to as PH rotation.

Figure 26:
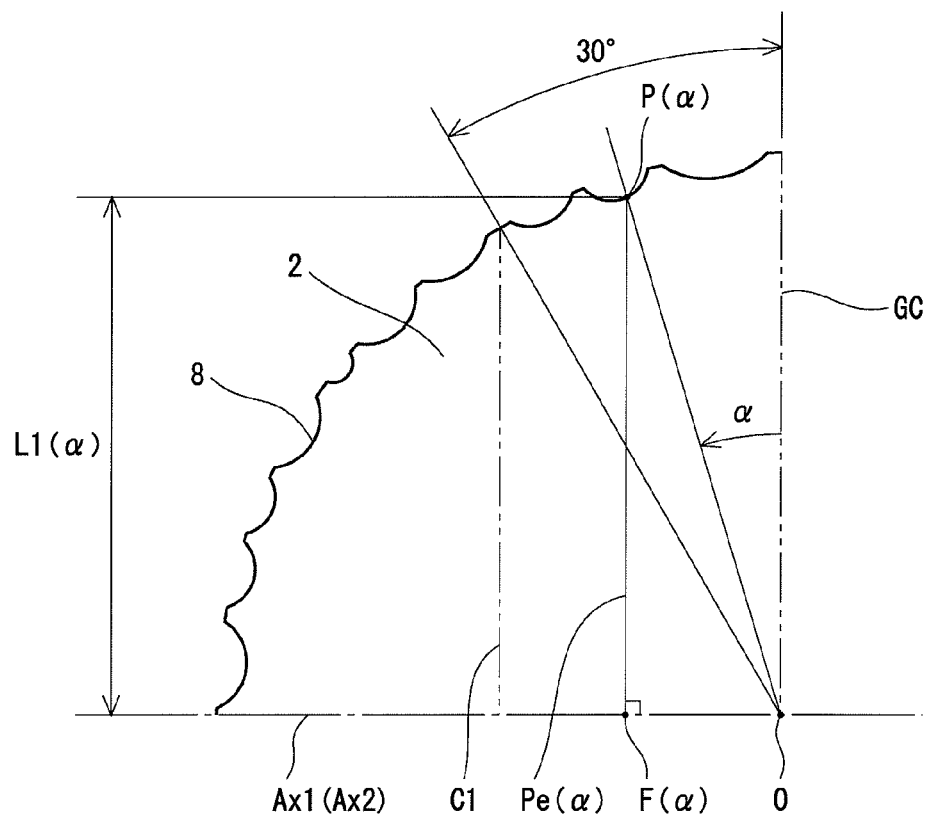
FIG. 26 is a schematic diagram for explaining the method for evaluating the golf ball in FIG. 2.

There is assumed a great circle GC that exists on the surface of the phantom sphere 14 of the golf ball 2 and is orthogonal to the first rotation axis Ax1. The circumferential speed of the great circle GC is faster than any other part of the golf ball 2 during rotation of the golf ball 2. In addition, there are assumed two small circles C1 and C2 that exist on the surface of the phantom sphere 14 of the golf ball 2 and are orthogonal to the first rotation axis Ax1. FIG. 26 schematically shows a partial cross-sectional view of the golf ball 2 in FIG. 25. In FIG. 26, the right-to-left direction is the direction of the first rotation axis Ax1. As shown in FIG. 26, the absolute value of the central angle between the small circle C1 and the great circle GC is 30°. Although not shown in the drawing, the absolute value of the central angle between the small circle C2 and the great circle GC is also 30°. The phantom sphere 14 is divided at the small circles C1 and C2, and of the surface of the golf ball 2, a region sandwiched between the small circles C1 and C2 is defined.

In FIG. 26, a point P($\alpha$) is the point which is located on the surface of the golf ball 2 and of which the central angle with the great circle GC is $\alpha$° (degree). A point F($\alpha$) is a foot of a perpendicular line Pe($\alpha$) which extends downward from the point P($\alpha$) to the first rotation axis Ax1. What is indicated by an arrow L1($\alpha$) is the length of the perpendicular line Pe($\alpha$). In other words, the length L1($\alpha$) is the distance between the point P($\alpha$) and the first rotation axis Ax1. For one cross section, the lengths L1($\alpha$) are calculated at twenty-one points P($\alpha$). Specifically, the lengths L1($\alpha$) are calculated at angles $\alpha$ of −30°, −27°, −24°, −21°, −18°, −15°, −12°, −9°, −6°, −3°, 0°, 3°, 6°, 9°, 12°, 15°, 18°, 21°, 24°, 27°, and 30°. The twenty-one lengths L1($\alpha$) are summed to obtain a total length L2 (mm). The total length L2 is a parameter dependent on the surface shape in the cross section shown in FIG. 26.

Figure 27:
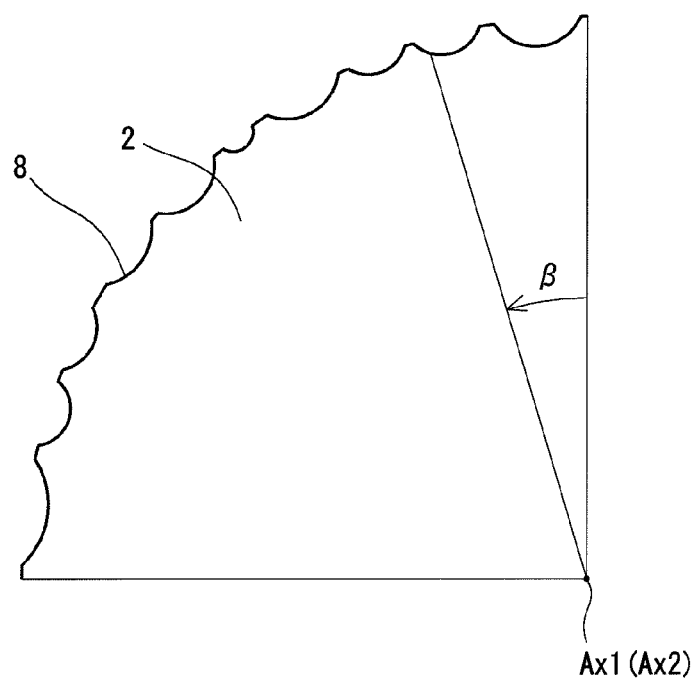
FIG. 27 is a schematic diagram for explaining the method for evaluating the golf ball in FIG. 2.

FIG. 27 shows a partial cross section of the golf ball 2. In FIG. 27, the direction perpendicular to the surface of the sheet is the direction of the first rotation axis Ax1. In FIG. 27, what is indicated by a reference sign $\beta$ is a rotation angle of the golf ball 2. In a range equal to or greater than 0° and smaller than 360°, the rotation angles $\beta$ are set at an interval of an angle of 0.25°. At each rotation angle, the total length L2 is calculated. As a result, 1440 total lengths L2 are obtained along the rotation direction. In other words, a data constellation regarding a parameter dependent on a surface shape appearing at a predetermined point moment by moment during one rotation of the golf ball 2, is calculated. The data constellation is calculated based on the 30240 lengths L1. The maximum and minimum values of the 1440 total length L2 are determined. The minimum value is subtracted from the maximum value to calculate a fluctuation range Rh. The fluctuation range Rh is a numeric value indicating an aerodynamic characteristic during PH rotation.

Further, a second rotation axis Ax2 orthogonal to the first rotation axis Ax1 is decided. Rotation of the golf ball 2 about the second rotation axis Ax2 is referred to as POP rotation. Similarly as for PH rotation, for POP rotation, a great circle GC and two small circles C1 and C2 are assumed. The absolute value of the central angle between the small circle C1 and the great circle GC is 30°. The absolute value of the central angle between the small circle C2 and the great circle GC is also 30°. For a region, sandwiched between the small circles C1 and C2, of the surface of the golf ball 2, 1440 total lengths L2 are calculated. In other words, a data constellation regarding a parameter dependent on a surface shape appearing at a predetermined point moment by moment during one rotation of the golf ball 2, is calculated. The maximum and minimum values of the 1440 total length L2 are determined. The minimum value is subtracted from the maximum value to calculate a fluctuation range Ro. The fluctuation range Ro is a numeric value indicating an aerodynamic characteristic during POP rotation.

There are numerous straight lines orthogonal to the first rotation axis Ax1. Thus, there are also numerous great circles GC. A great circle GC, whose part included in the dimples 8 is the longest, is selected, and a fluctuation range Ro and a difference dR are calculated. Instead of this, twenty great circles GC may be extracted in a random manner, and twenty fluctuation ranges may be calculated based on the extracted twenty great circles GC. In this case, the maximum value among twenty pieces of data is set as Ro.

The smaller the fluctuation range Rh is, the larger the flight distance at PH rotation is. The reason is inferred to be that the smaller the fluctuation range Rh is, the more smoothly transition of a turbulent flow continues. In this respect, the fluctuation range Rh is preferably equal to or less than 3.0 mm and particularly preferably equal to or less than 2.7 mm. The smaller the fluctuation range Ro is, the larger the flight distance at POP rotation is. The reason is inferred to be that the smaller the fluctuation range Ro is, the more smoothly transition of a turbulent flow continues. In this respect, the fluctuation range Ro is preferably equal to or less than 3.0 mm and particularly preferably equal to or less than 2.7 mm. In light of attainment of a large flight distance at any of PH rotation and POP rotation, both the fluctuation range Rh and the fluctuation range Ro are preferably equal to or less than 3.0 mm and particularly preferably equal to or less than 2.7 mm.

In the Voronoi tessellation, a large number of Voronoi regions are assumed on the surface of the phantom sphere such that one generating point is included in one of the Voronoi regions. By a method other than the Voronoi tessellation, a large number of regions may be assumed on the surface of the phantom sphere such that one point is included in one of the regions.

Figure 28:
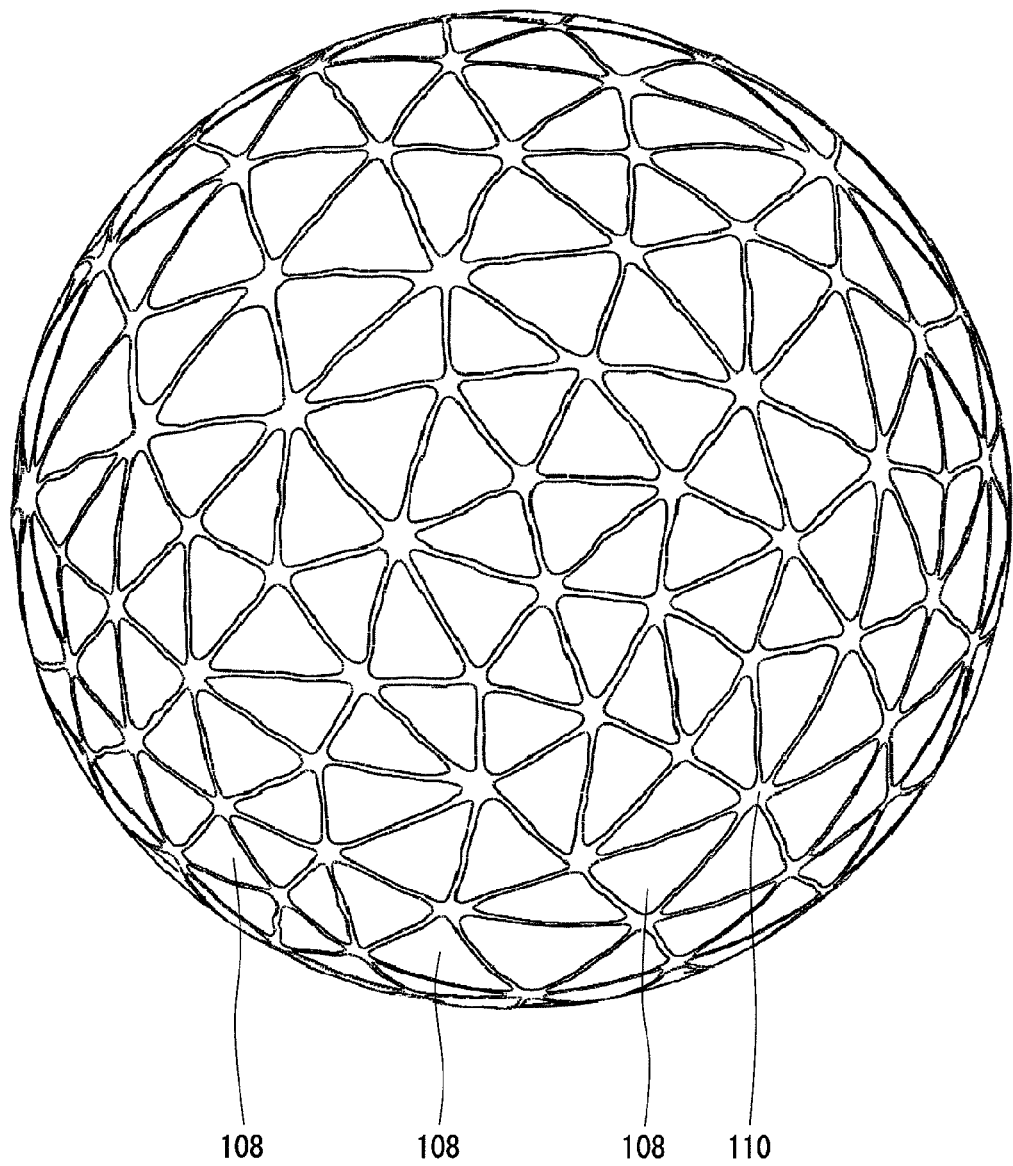
FIG. 28 is an enlarged front view of a golf ball according to another embodiment of the present invention.
Figure 29:
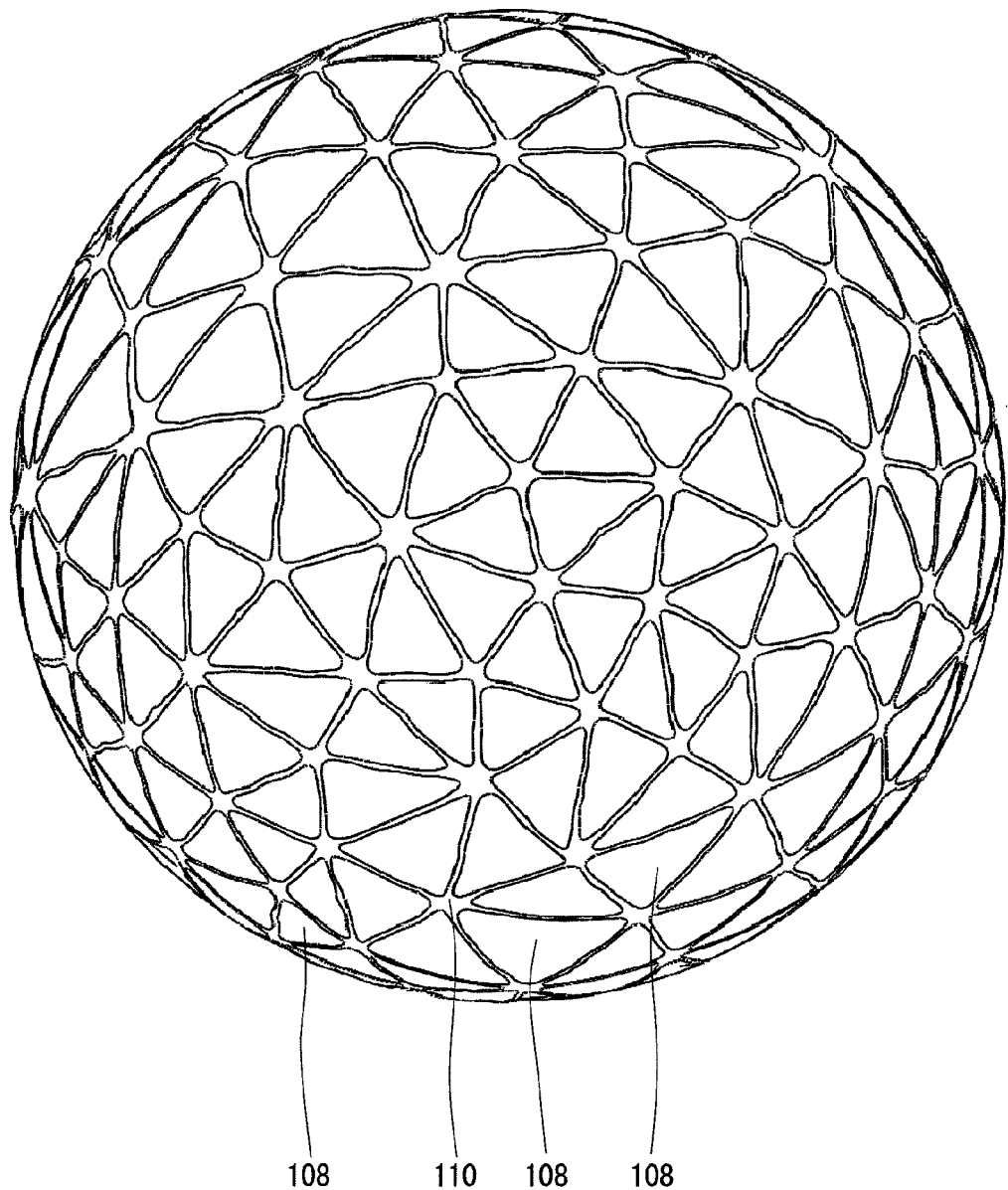
FIG. 29 is a plan view of the golf ball in FIG. 28.

FIG. 28 is an enlarged front view of a golf ball 102 according to another embodiment of the present invention. FIG. 29 is a plan view of the golf ball 102 in FIG. 28. As is obvious from FIGS. 28 and 29, a large number of dimples 108 are randomly arranged. By these dimples 108 and a land 110, a rugged pattern is formed on the surface of the golf ball 102.

In a method for designing the rugged pattern, a Delaunay triangulation is used. In the designing method, a large number of generating points are randomly arranged on the surface of a phantom sphere. Based on the generating points, a large number of regions are assumed on the surface of the phantom sphere by the Delaunay triangulation. In the present specification, the regions are referred to as "Delaunay regions". Based on the Delaunay regions, dimples 108 are assigned.

Preferably, a Cellular Automaton method is used for arranging generating points. The same Cellular Automaton method as that described above for designing of the dimple pattern shown in FIGS. 2 and 3 can be used. By the Cellular Automaton method, a pattern in which a large number of loops are randomly arranged on the surface of the phantom sphere is obtained. The central points of these loops are set as generating points. Since the arrangement of the loops is random, the arrangement of the generating points is also random.

Figure 30:
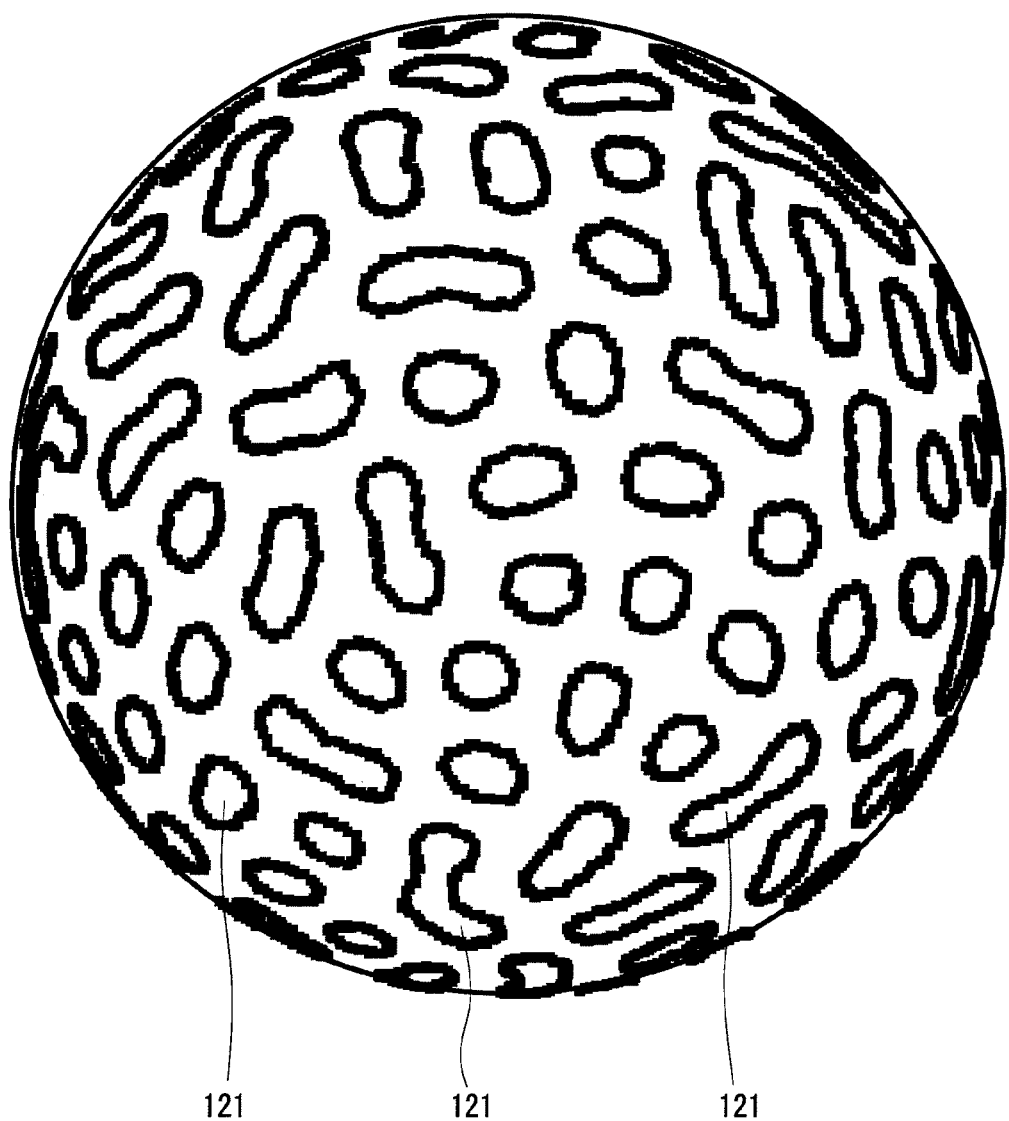
FIG. 30 is a front view of a pattern having first loops.

A pattern that is obtained by the Cellular Automaton method and has a large number of first loops 121 is shown in FIG. 30. The pattern is obtained by using the following parameters.

W1: 1.0
W2: −0.6
R1: 6.5
R2: 11.3
Number of cells: 88266

Figure 31:
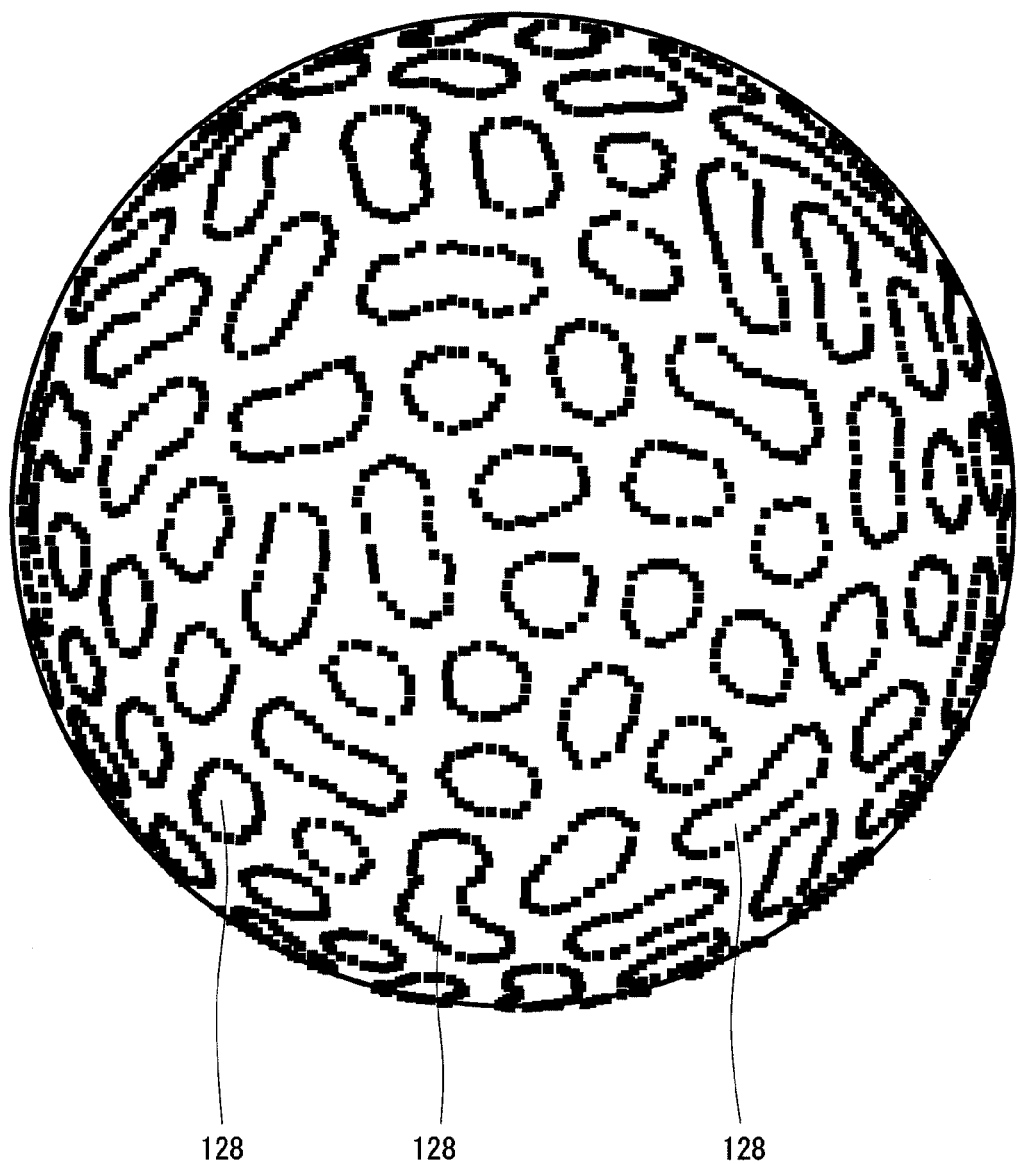
FIG. 31 is a front view of a pattern having second loops.
Figure 32:
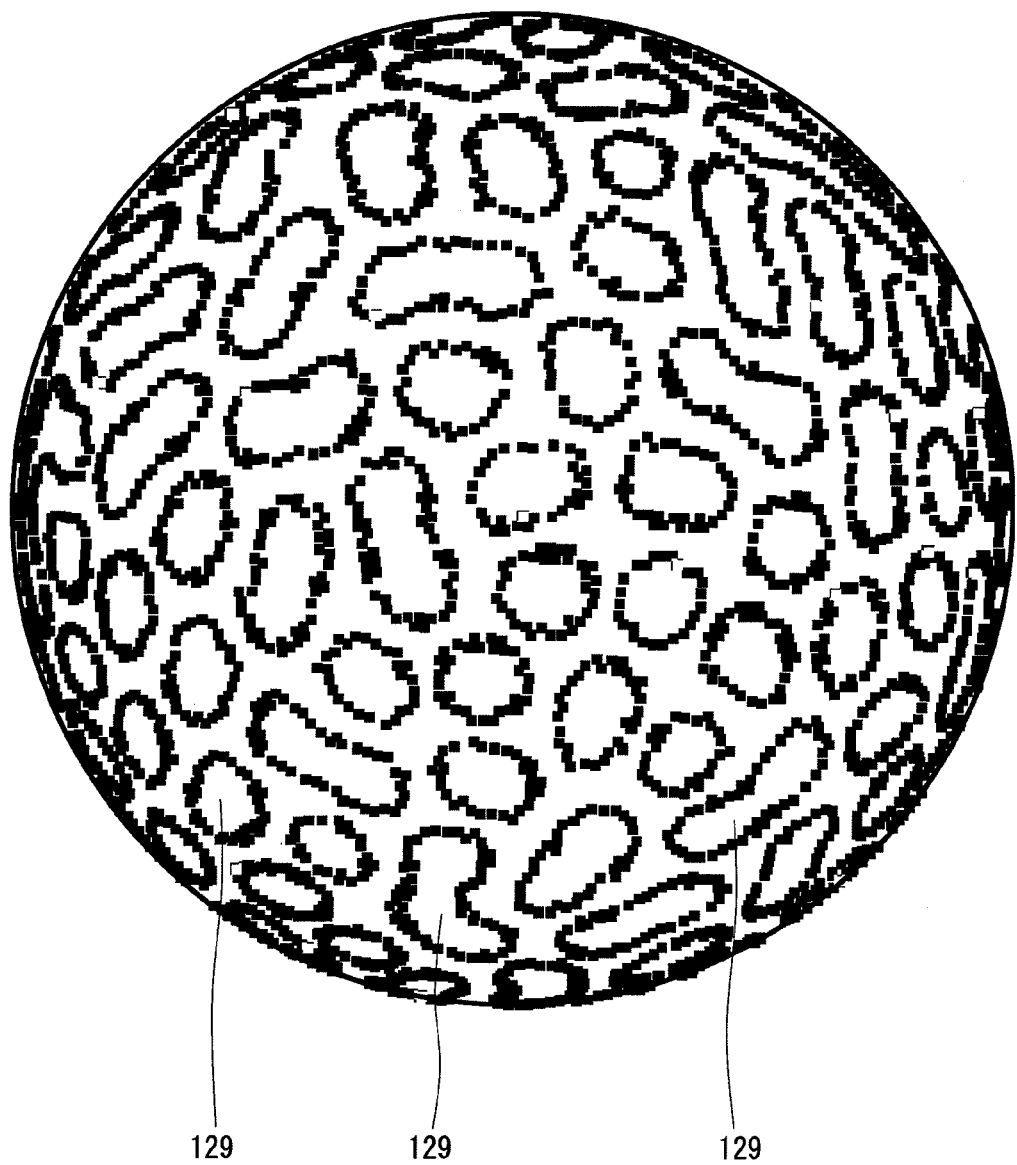
FIG. 32 is a front view of a pattern having third loops.

The pattern in FIG. 30 is updated to increase an occupation ratio. A pattern resulting from update for the first time is shown in FIG. 31. The pattern has a large number of second loops 128. A pattern resulting from update for the second time is shown in FIG. 32. The pattern has a large number of third loops 129. The aforementioned smoothing is performed on the third loops 129. Reference points of each smoothed loop are connected to each other by a spline curve to assume a new loop. A pattern having these loops is shown in FIGS. 33 and 34.

Figure 33:
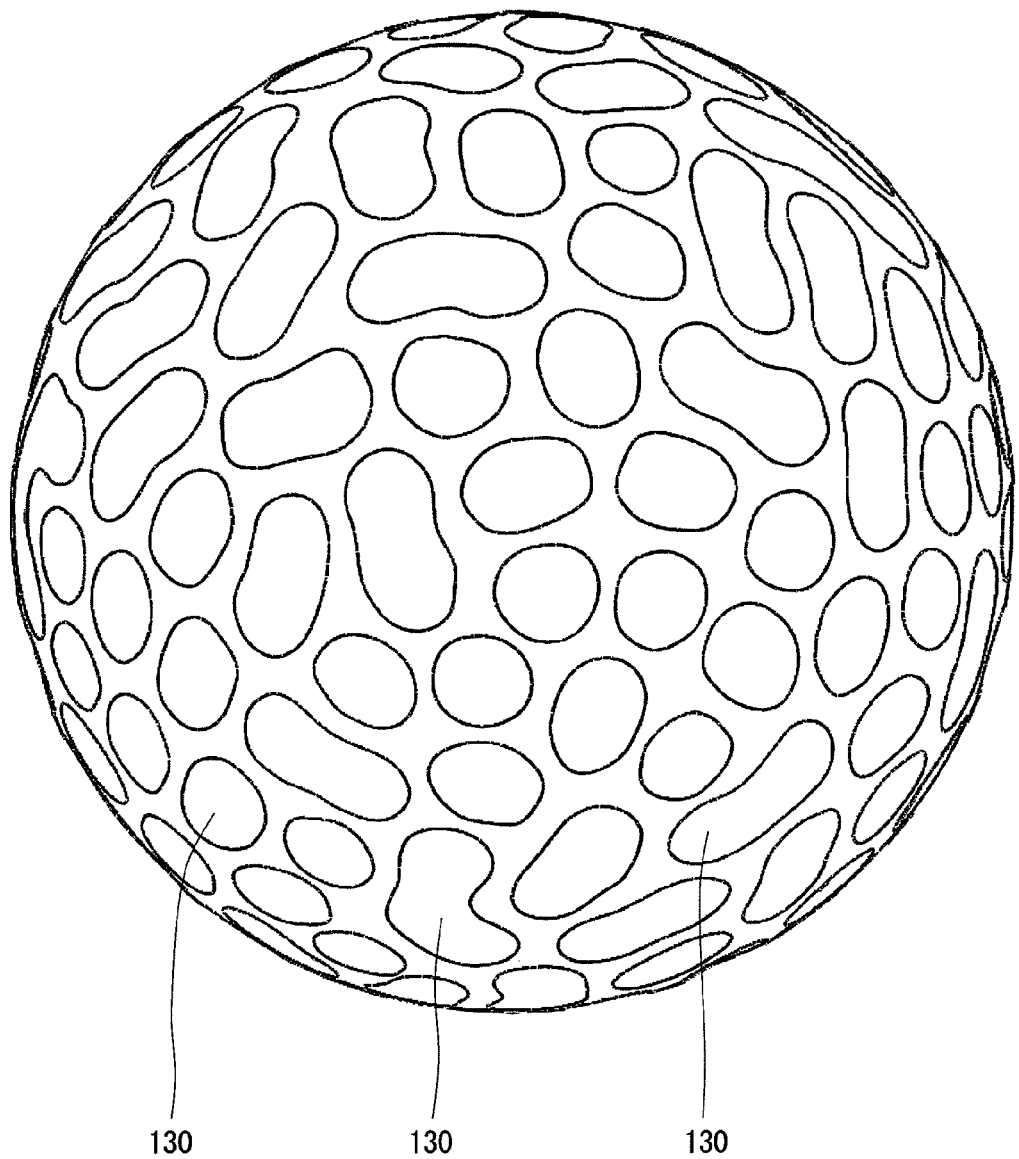
FIG. 33 is a front view of a pattern having a large number of loops.
Figure 34:
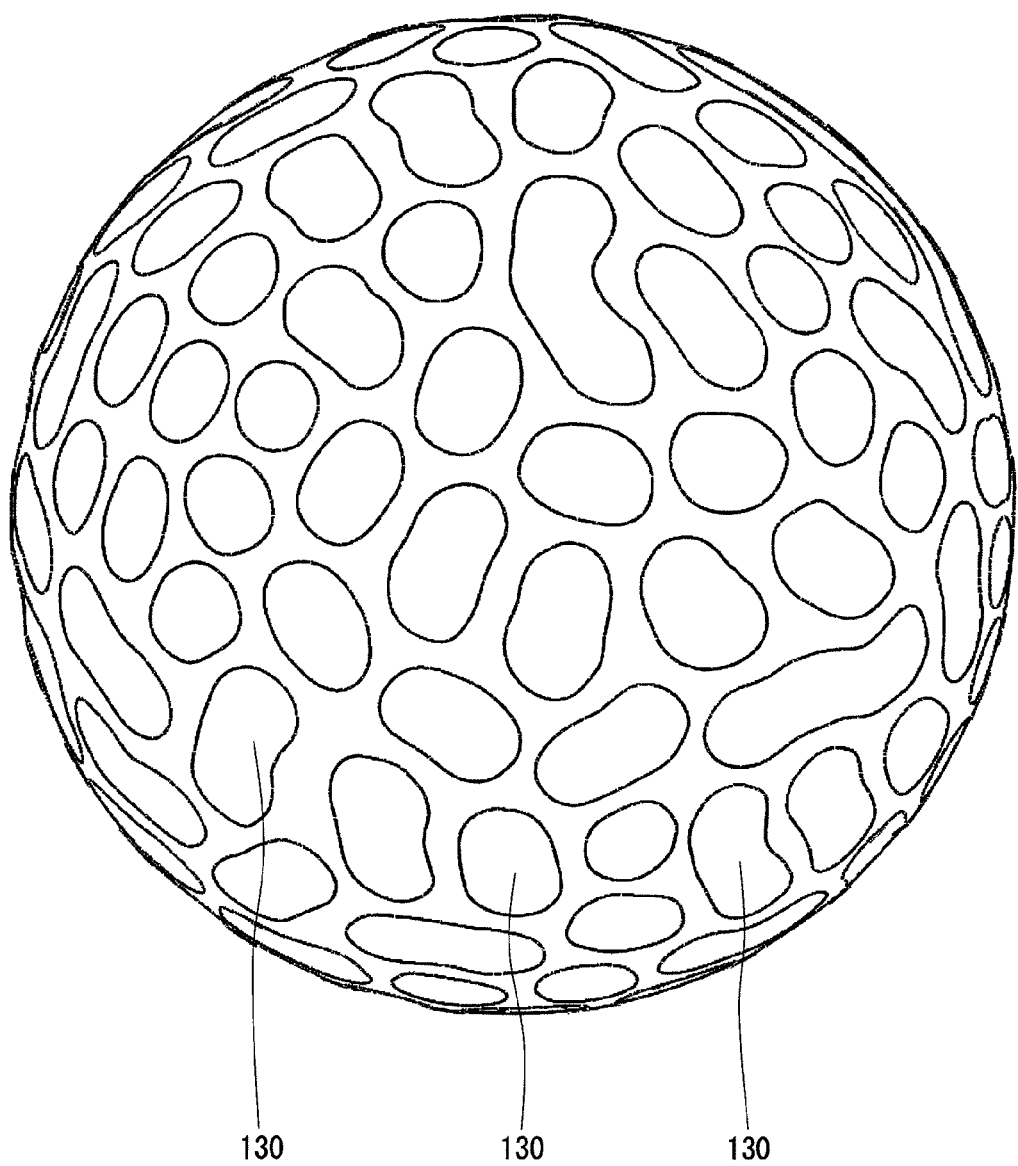
FIG. 34 is a plan view of the pattern in FIG. 33.
Figure 35:
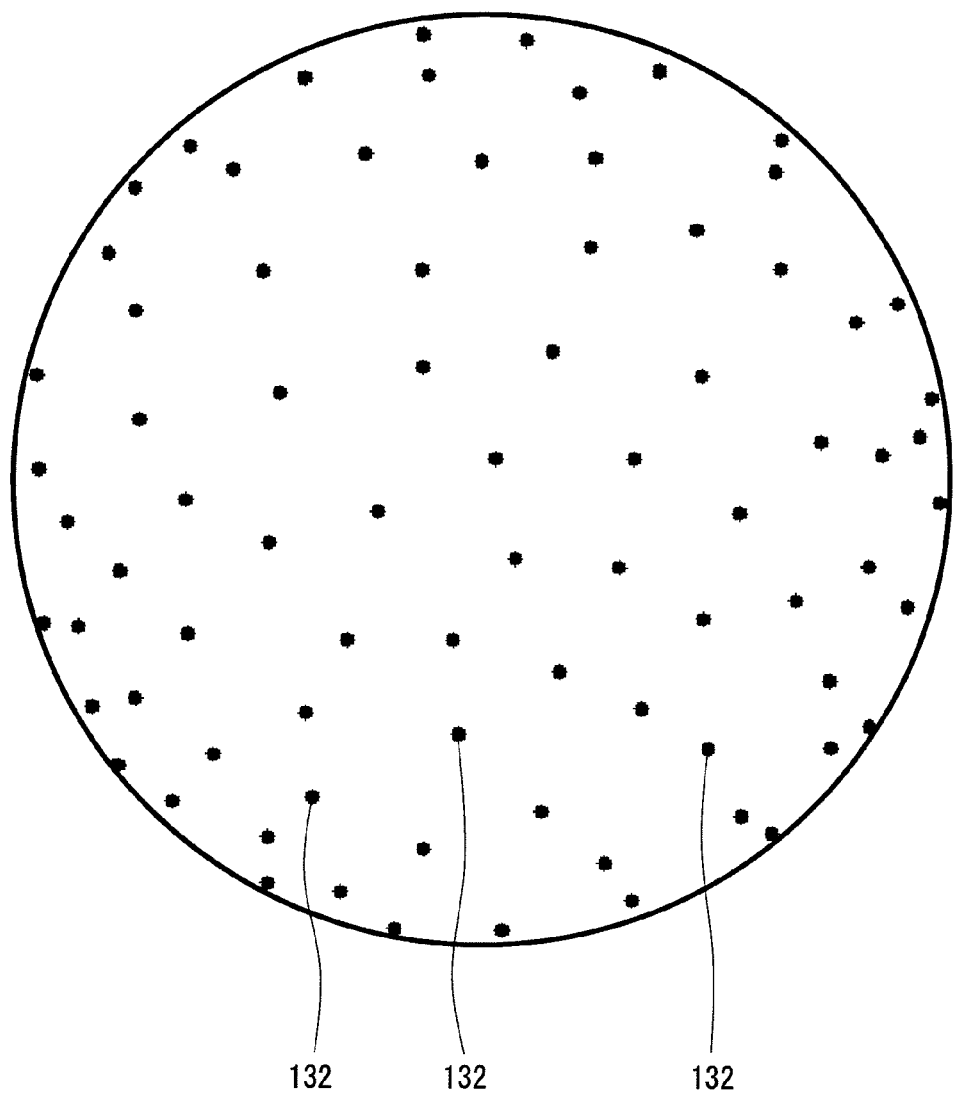
FIG. 35 is a front view showing a large number of generating points.

Based on the pattern of loops 130 shown in FIGS. 33 and 34, a dimple pattern is obtained by the Delaunay triangulation. In the Delaunay triangulation, the central point of each loop 130 is obtained. A coordinate of the central point is obtained by calculating the average of coordinates of: cells on the contour of the loop 130; and cells present inside the contour. The coordinate of the central point may be obtained by calculating the average of the coordinates of only the cells present inside the contour of the loop 130. The coordinate of the central point may be obtained by calculating the average of the coordinates of only the cells present on the contour of the loop 130. Hereinafter, the central point is referred to as a generating point. FIG. 35 shows a large number of generating points 132. Since the loops 130 are randomly arranged, the generating points 132 are also randomly arranged on the surface of the phantom sphere.

Based on the first loops 121 shown in FIG. 30, generating points may be decided. In this case as well, a large number of the generating points arranged randomly are obtained. Based on the second loops 128 shown in FIG. 31, generating points may be decided. In this case as well, a large number of the generating points arranged randomly are obtained. Based on the third loops 129 shown in FIG. 32, generating points may be decided. In this case as well, a large number of the generating points arranged randomly are obtained.

Based on these generating points 132, the surface of the phantom sphere is divided into a large number of triangles (Delaunay regions) by the Delaunay triangulation. The following will describe a method of this division.

In the method, arbitrary three generating points are selected from a large number of the generating points 132. A triangle whose vertices are these three generating points 132 is assumed. A circumcircle of the triangle is assumed. When none of the generating points other than these three generating points are included in the circumcircle, the triangle is determined as a Delaunay region. For all combinations of three generating points, this determination is performed. Due to this, the entire surface of the phantom sphere is divided into a large number of Delaunay regions.

Figure 36A:
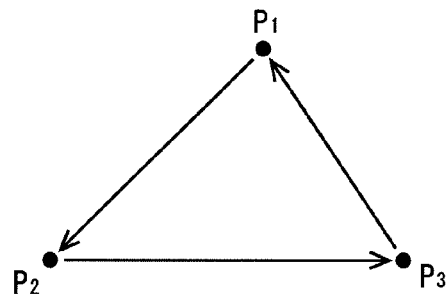
FIGS. 36A to 36D are diagrams for illustrating a method for deciding a Delaunay region to which a cell belongs.
Figure 36B:
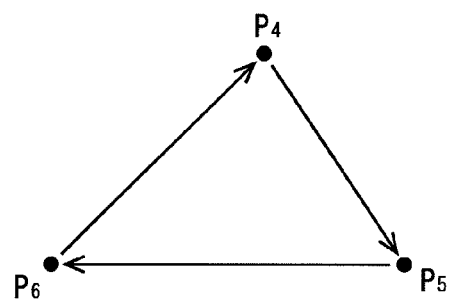

It is decided which Delaunay region each cell on the surface of the phantom sphere belongs to. The following will describe a method of this decision. In a triangle $P_1P_2P_3$ (Delaunay region) shown in FIG. 36A, a vector $P_1P_2$, a vector $P_2P_3$, and a vector $P_3P_1$ are connected to each other in the counterclockwise direction. Thus, a normal vector for the triangle $P_1P_2P_3$ in a right-handed coordinate system is perpendicular to the surface of the sheet and directed in the upward direction with respect to the surface of the sheet. In a triangle $P_4P_5P_6$ (Delaunay region) shown in FIG. 36B, a vector $P_4P_5$, a vector $P_5P_6$, and a vector $P_6P_4$ are connected to each other in the clockwise direction. Thus, a normal vector for the triangle $P_4P_5P_6$ in the right-handed coordinate system is perpendicular to the surface of the sheet and directed in the downward direction with respect to the surface of the sheet. In the triangle $P_4P_5P_6$ for which the normal vector is directed in the downward direction, a second vertex $P_5$ and a third vertex $P_6$ are interchanged with each other. In other words, the triangle $P_4P_5P_6$ is redefined as a triangle $P_4P_6P_5$. All triangles for which normal vectors are directed in the downward direction are redefined. On the surface of the phantom sphere after the redefinition is performed, the normal vectors for all the triangles are directed in the upward direction.

Figure 36C:
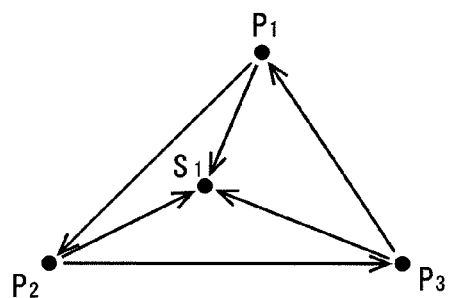

FIG. 36C shows the triangle $P_1P_2P_3$ and a cell $S_1$. In this example, three outer product vectors $(P_1P_2 \times P_1S_1)$ $(P_2P_3 \times P_2S_1)$ and $(P_3P_1 \times P_3S_1)$ are directed in the upward direction with respect to the surface of the sheet. When the directions of the three outer product vectors with respect to the surface of the sheet are the same, the cell $S_1$ is included in the triangle $P_1P_2P_3$.

Figure 36D:
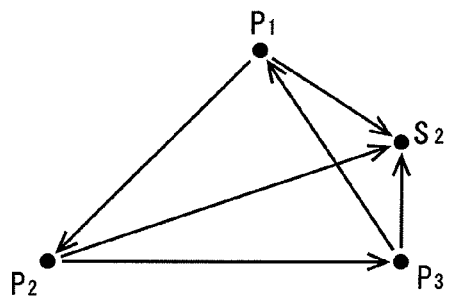

FIG. 36D shows the triangle $P_1P_2P_3$ and a cell $S_2$. In this example, two outer product vectors $(P_1P_2 \times P_1S_2)$ and $(P_2P_3 \times P_2S_2)$ are directed in the upward direction with respect to the surface of the sheet. On the other hand, an outer product vector $(P_3P_1 \times P_3S_2)$ is directed in the downward direction with respect to the surface of the sheet. When the directions of the three outer product vectors with respect to the surface of the sheet are not the same, the cell $S_2$ is not included in the triangle $P_1P_2P_3$.

Figure 37:
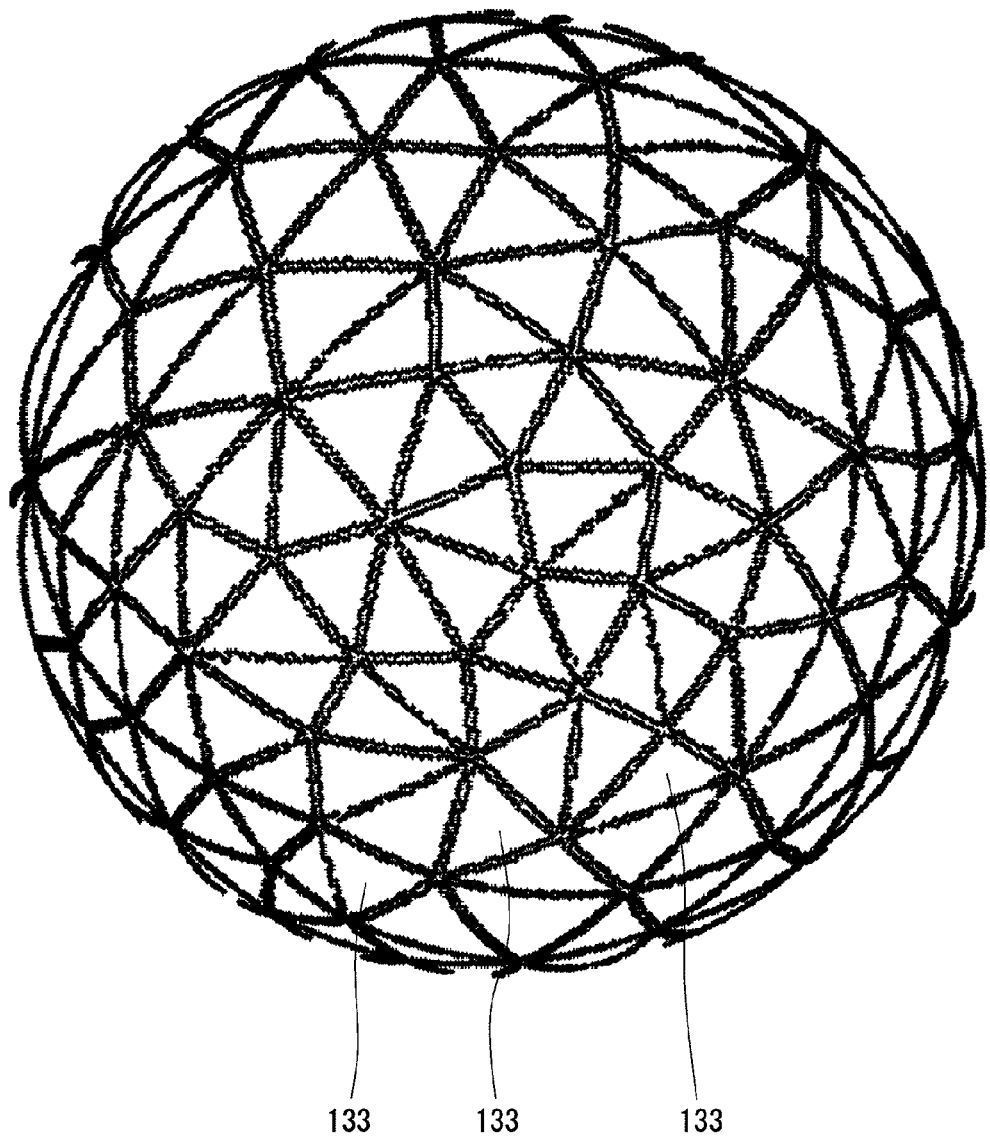
FIG. 37 is a front view showing Delaunay regions obtained by a simple method.

For each of all the cells, a Delaunay region to which each cell belongs is decided. In FIG. 37, when another cell 16 adjacent to a cell 16 belongs to a Delaunay region 133 different from a Delaunay region 133 to which this cell 16 belongs, this cell 16 is filled with black.

As is obvious from FIG. 37, the contour of each Delaunay region 133 is a zigzag contour. The smoothing and thinning-out described above for the Cellular Automaton method are performed on the contour to draw a spline curve. By the spline curve, a loop is obtained. The loop may be enlarged or reduced in size to obtain a new loop. A land 110 is assigned to the outside of the loop. In other words, a land 110 is assigned to the vicinity of the contour of the Delaunay region 133. Meanwhile, a dimple 108 is assigned to the inside of the loop. In this manner, a rugged pattern shown in FIGS. 28 and 29 is obtained.

In the rugged pattern shown in FIGS. 28 and 29, a large number of the dimples 108 are randomly arranged. Each dimple 108 has a contour shape different from that of any of the other dimples 108. The golf ball 102 having the rugged pattern has excellent aerodynamic symmetry.

In light of suppression of rising of the golf ball 102 during flight, each dimple 108 has a depth of preferably 0.05 mm or greater, more preferably 0.08 mm or greater, and particularly preferably 0.10 mm or greater. In light of suppression of dropping of the golf ball 102 during flight, the depth is preferably equal to or less than 0.60 mm, more preferably equal to or less than 0.45 mm, and particularly preferably equal to or less than 0.40 mm. The depth is the distance between the deepest point of the dimple 108 and the surface of the phantom sphere.

In light of suppression of rising of the golf ball 102 during flight, the sum of the volumes (total volume) of all the dimples 108 is preferably equal to or greater than 400 mm$^3$, more preferably equal to or greater than 450 mm$^3$, and particularly preferably equal to or greater than 500 mm$^3$. In light of suppression of dropping of the golf ball 102 during flight, the sum is preferably equal to or less than 750 mm$^3$, more preferably equal to or less than 700 mm$^3$, and particularly preferably equal to or less than 650 mm$^3$.

In light of flight performance, the ratio (occupation ratio) of the sum of the areas of the dimples 108 to the surface area of the phantom sphere is preferably equal to or greater than 65%, more preferably equal to or greater than 75%, and particularly preferably equal to or greater than 80%.

From the standpoint that a fundamental feature of the golf ball 102 being substantially a sphere is not impaired, the total number of the dimples 108 is preferably equal to or greater than 250 and particularly preferably equal to or greater than 300. From the standpoint that each dimple 8 exerts a sufficient dimple effect, the total number is preferably equal to or less than 450 and particularly preferably equal to or less than 400.

Preferably, the golf ball 2 has a difference dR whose absolute value is equal to or less than 0.50 mm. The smaller the absolute value is, the smaller the difference between the trajectory during PH rotation and the trajectory during POP rotation is. In this respect, the absolute value is more preferably equal to or less than 0.45 mm and particularly preferably equal to or less than 0.40 mm.

The smaller a fluctuation range Rh is, the larger the flight distance at PH rotation is. The reason is inferred to be that the smaller the fluctuation range Rh is, the more smoothly transition of a turbulent flow continues. In this respect, the fluctuation range Rh is preferably equal to or less than 3.0 mm and particularly preferably equal to or less than 2.7 mm. The smaller a fluctuation range Ro is, the larger the flight distance at POP rotation is. The reason is inferred to be that the smaller the fluctuation range Ro is, the more smoothly transition of a turbulent flow continues. In this respect, the fluctuation range Ro is preferably equal to or less than 3.0 mm and particularly preferably equal to or less than 2.7 mm. In light of attainment of a large flight distance at any of PH rotation and POP rotation, both the fluctuation range Rh and the fluctuation range Ro are preferably equal to or less than 3.0 mm and particularly preferably equal to or less than 2.7 mm.

In the Delaunay triangulation, a large number of Delaunay regions are assumed on the surface of the phantom sphere by connecting one generating point to another generating point by a line. By a method, other than the Delaunay triangulation, in which one point and another point are connected by a line, a large number of regions may be assumed on the surface of the phantom sphere.

EXAMPLES

[Evaluation 1]

A pattern of Example 1 shown in FIGS. 2 and 3 was designed. The pattern has 391 dimples.

Further, a pattern of Comparative Example 1 shown in FIGS. 20 and 21 was designed. The pattern has 391 dimples.

By the aforementioned method, fluctuation ranges Ro and Rh of each pattern were calculated. The results are shown in Table 1 below.

TABLE 1

Results of Evaluation

Figure 38:
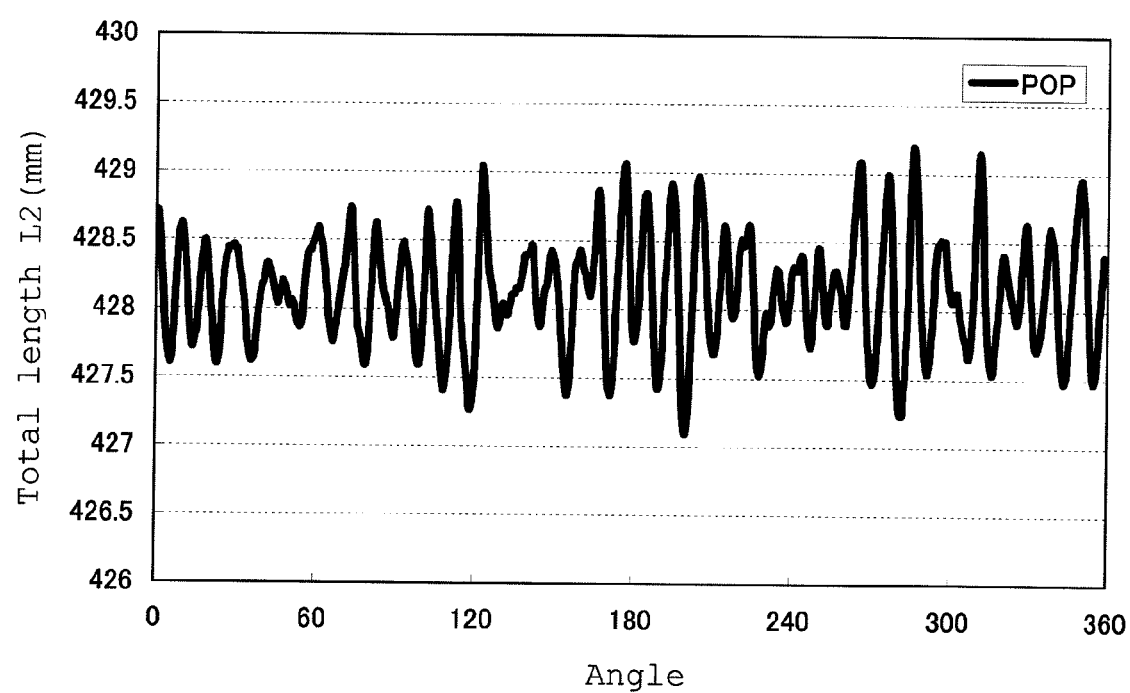
FIG. 38 is a graph showing an evaluation result of a golf ball according to Example 1 of the present invention.
Figure 39:
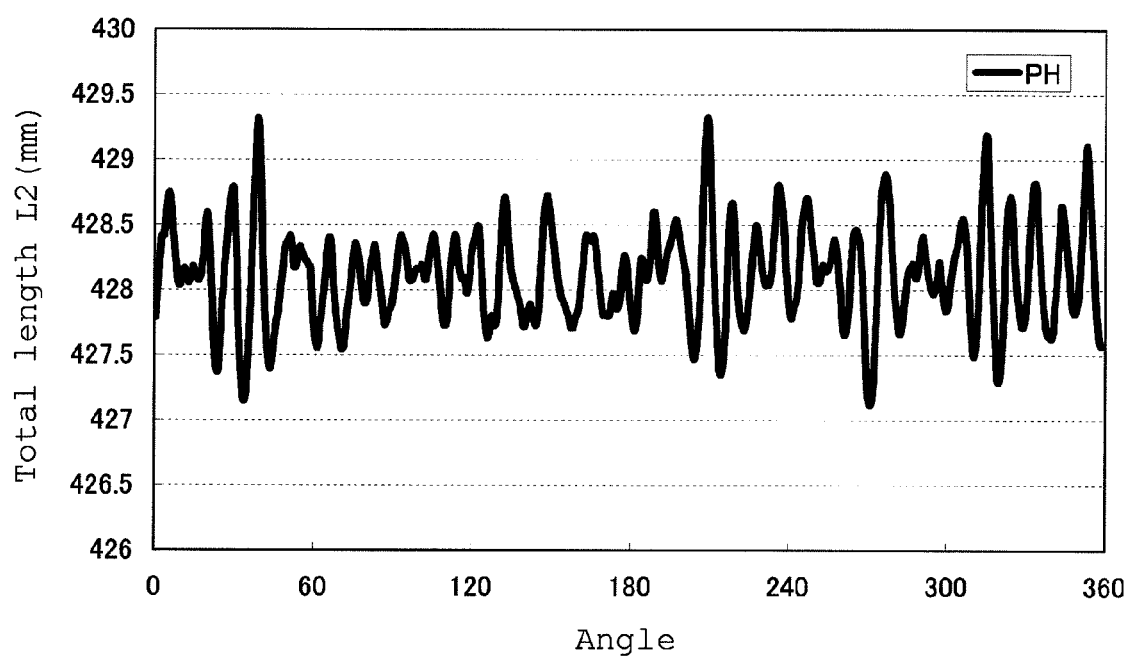
FIG. 39 is a graph showing another evaluation result of the golf ball according to Example 1 of the present invention.
Figure 40:
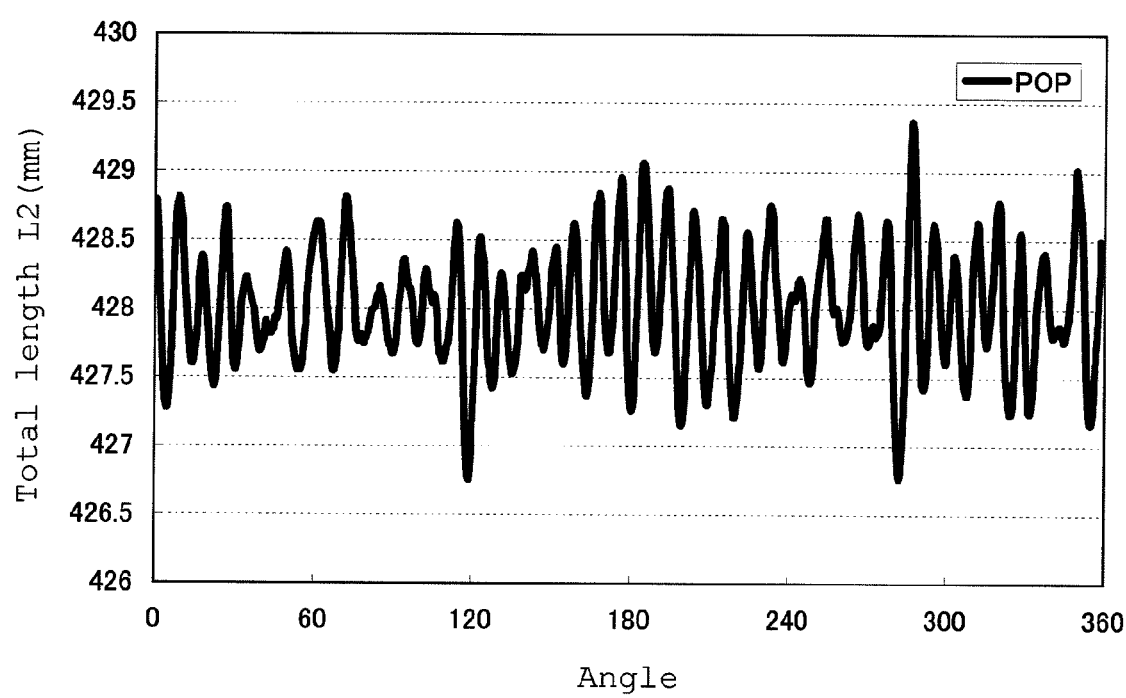
FIG. 40 is a graph showing an evaluation result of a golf ball according to Comparative Example 1.
Figure 41:
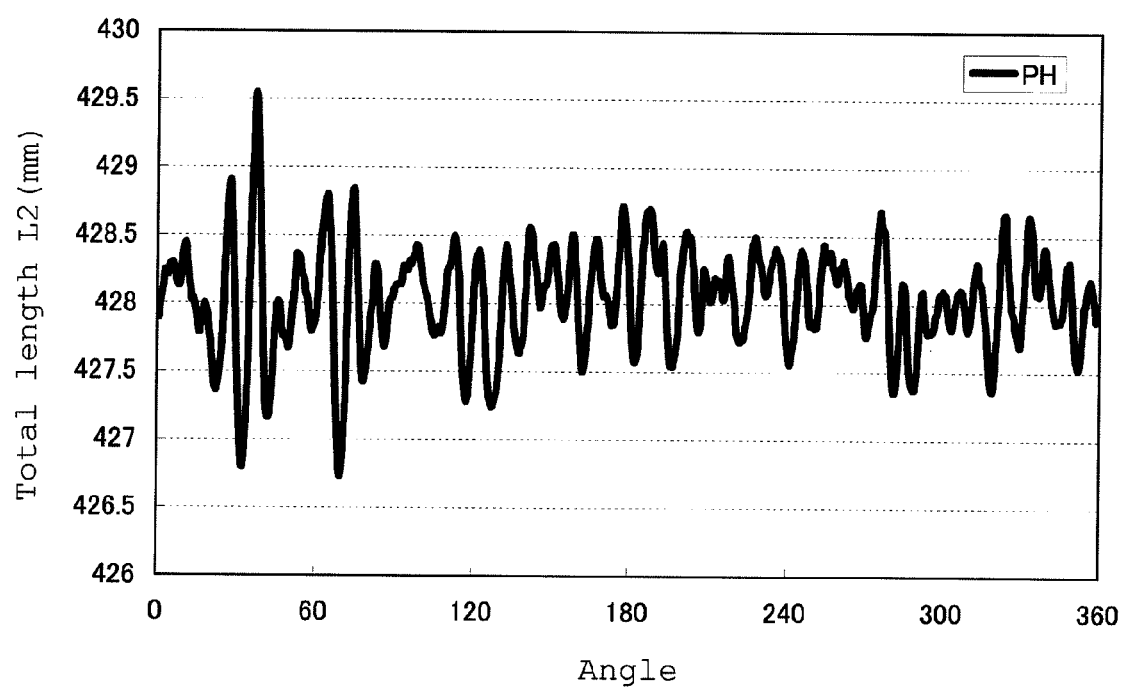
FIG. 41 is a graph showing another evaluation result of the golf ball according to Comparative Example 1.

|  |  | Example 1 | Compara. Example 1 |
|---|---|---|---|
| Front view |  | FIG. 2 | FIG. 20 |
| Plan view |  | FIG. 3 | FIG. 21 |
| Occupation ratio (%) |  | 82.6 | 76.6 |
| Maximum depth (mm) |  | 0.170 | 0.189 |
| Total volume (mm$^3$) |  | 577 | 570 |
| POP rotation | Graph | FIG. 38 | FIG. 40 |
|  | Ro (mm) | 2.103 | 2.611 |
| PH rotation | Graph | FIG. 39 | FIG. 41 |
|  | Rh (mm) | 2.209 | 2.822 |
| dR (mm) |  | 0.106 | 0.211 |

As shown in Table 1, the fluctuation ranges Ro and Rh of the pattern of Example 1 are small. From the results of evaluation, advantages of the present invention are clear.

[Evaluation 2]

A pattern of Example 2 shown in FIGS. 28 and 29 was designed. The pattern has 312 dimples.

Further, a pattern of Comparative Example 2 shown in FIGS. 33 and 34 was designed. The pattern has 158 dimples.

Figure 46:
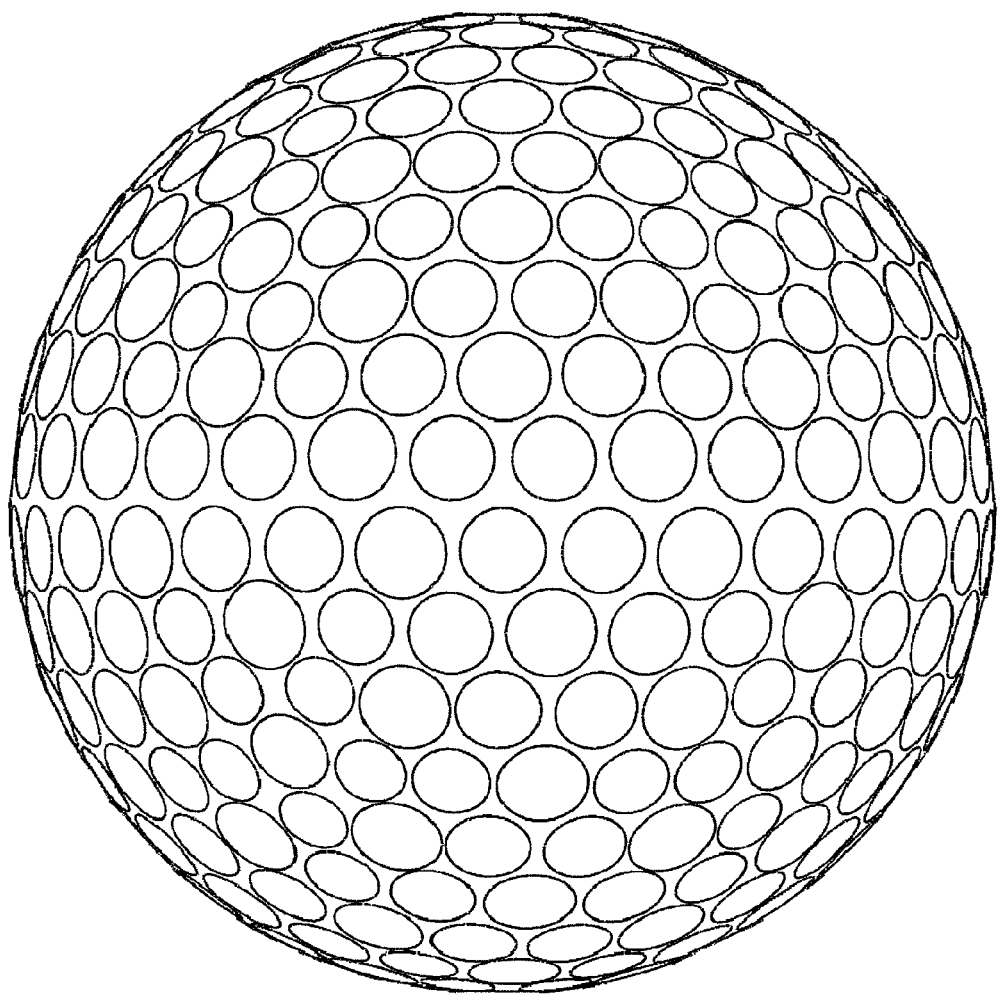
FIG. 46 is an enlarged front view of a golf ball according to Comparative Example 3.
Figure 47:
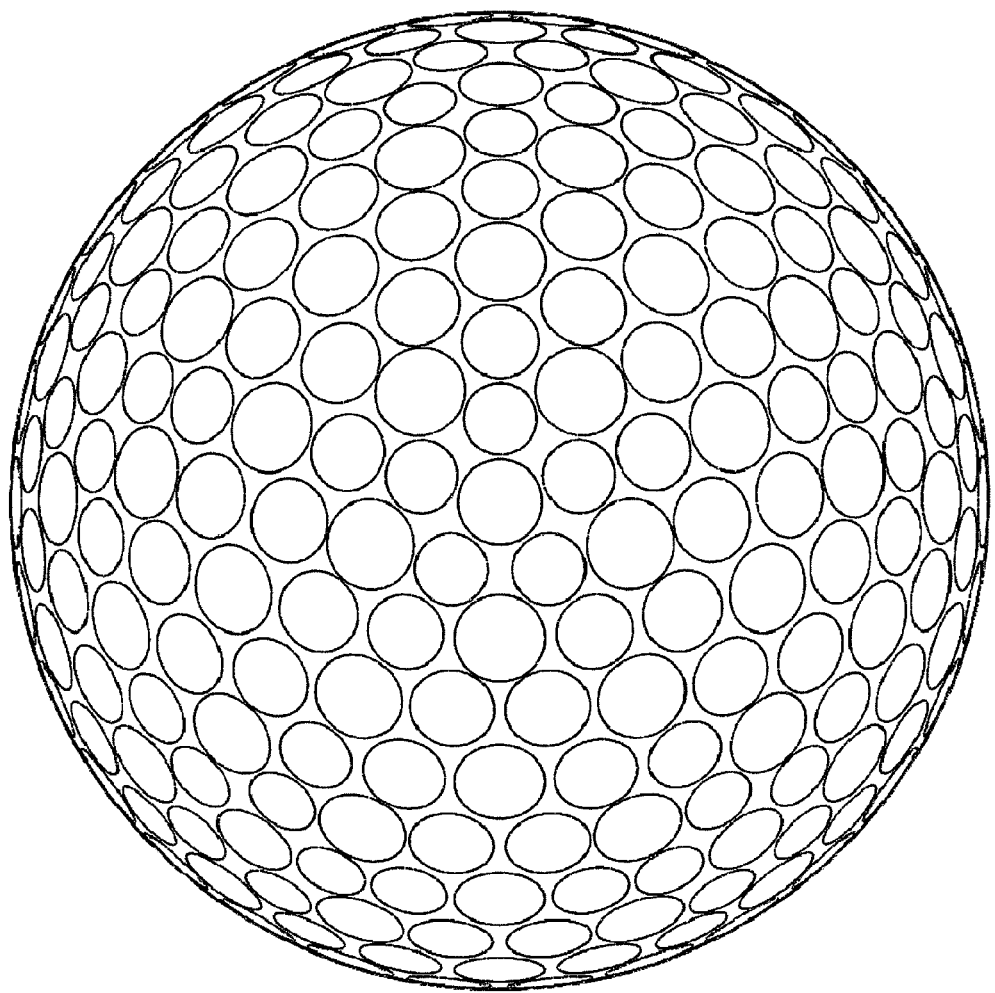
FIG. 47 is a plan view of the golf ball in FIG. 46.

Further, a pattern of Comparative Example 3 shown in FIGS. 46 and 47 was designed. The pattern has 392 dimples.

By the aforementioned method, fluctuation ranges Ro and Rh of each pattern were calculated. The results are shown in Table 2 below.

TABLE 2

Results of Evaluation

|  | Example 2 | Compara. Example 2 | Compara. Example 3 |
|---|---|---|---|
| Front view | FIG. 28 | FIG. 33 | FIG. 46 |
| Plan view | FIG. 29 | FIG. 34 | FIG. 47 |
| Occupation ratio (%) | 83.4 | 59.7 | 73.4 |

TABLE 2-continued

Results of Evaluation

Figure 42:
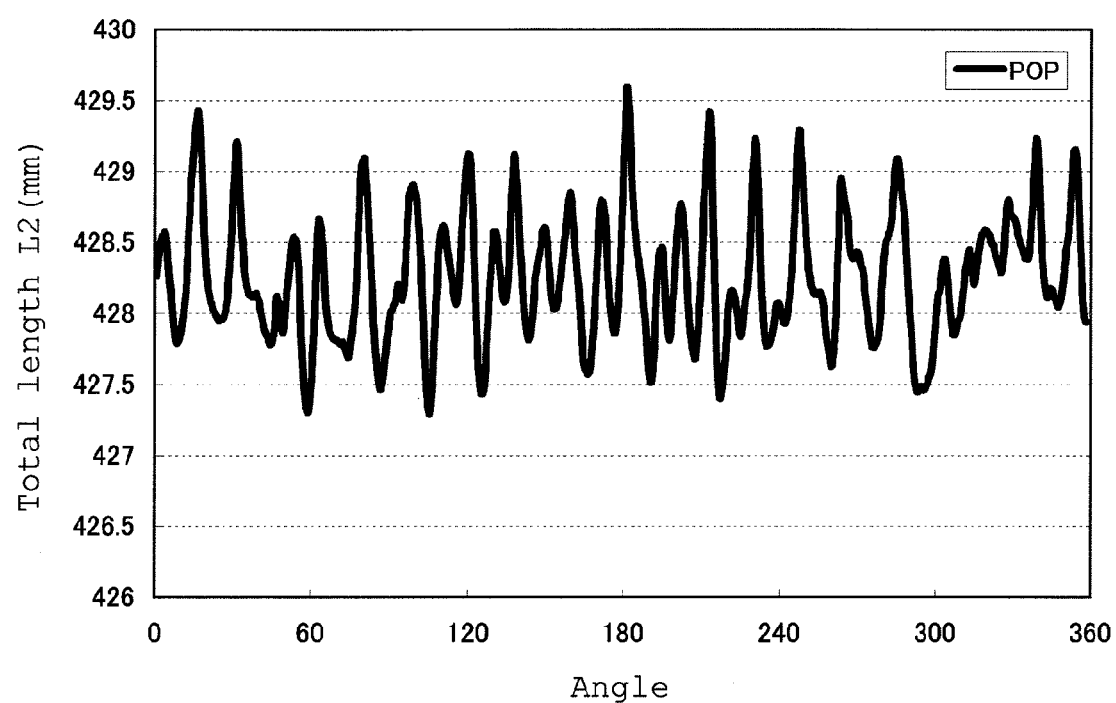
FIG. 42 is a graph showing an evaluation result of a golf ball according to Example 2 of the present invention.
Figure 43:
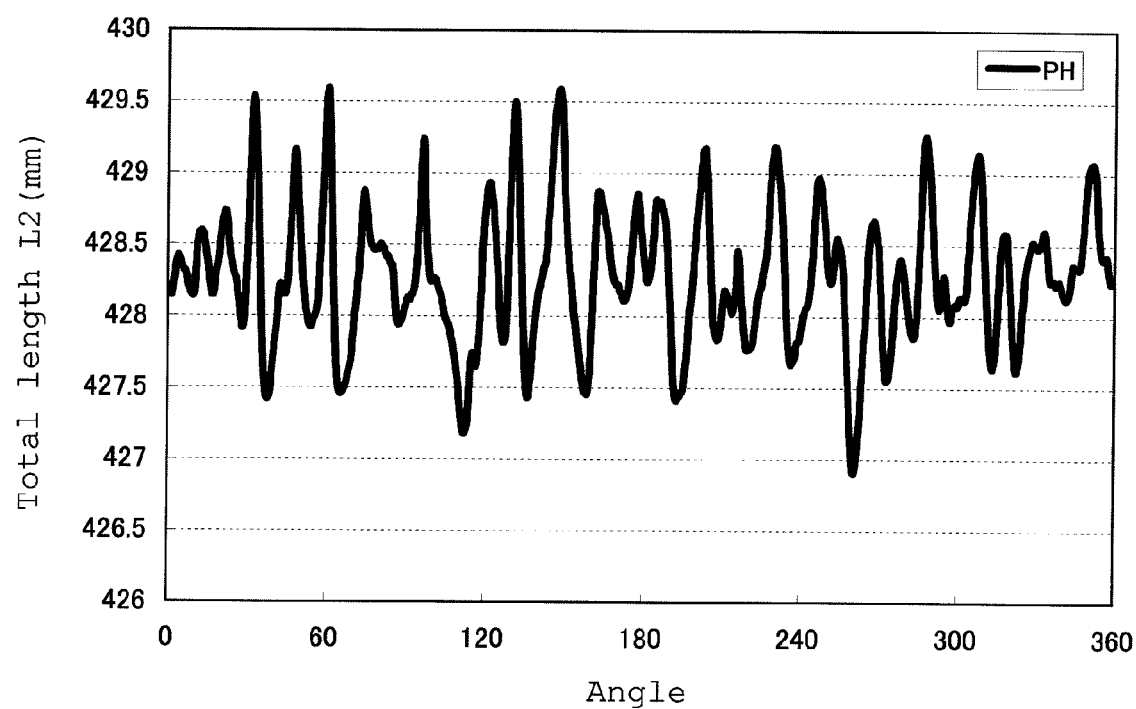
FIG. 43 is a graph showing another evaluation result of the golf ball according to Example 2 of the present invention.
Figure 44:
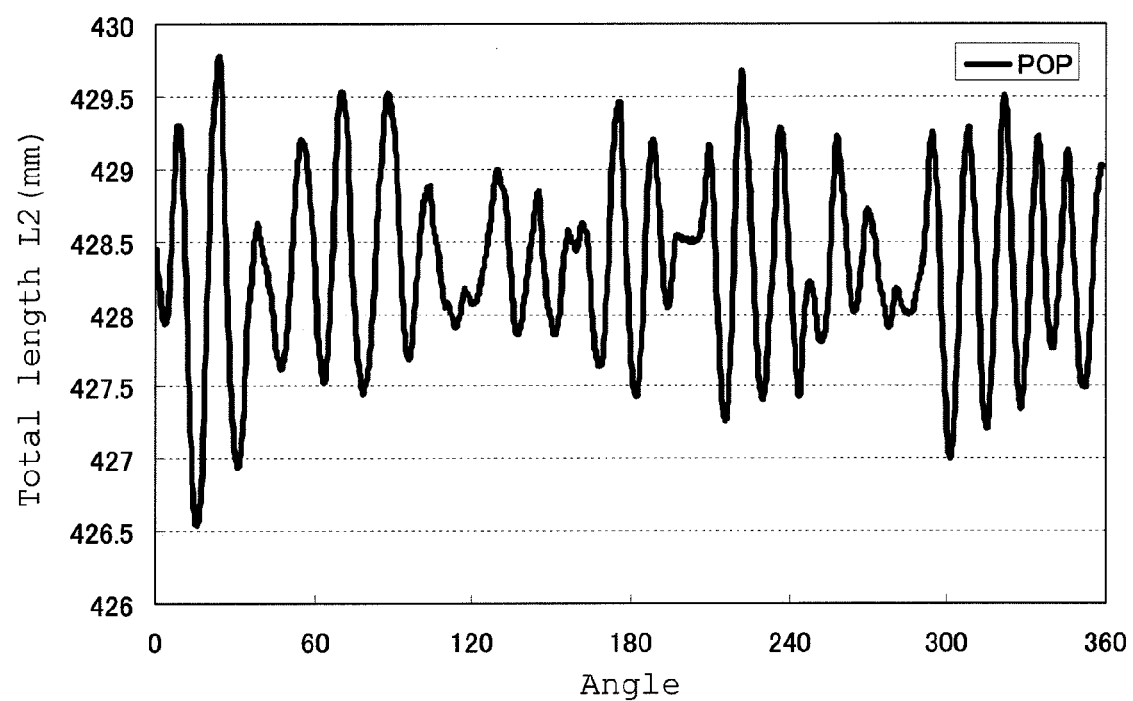
FIG. 44 is a graph showing an evaluation result of a golf ball according to Comparative Example 2.
Figure 45:
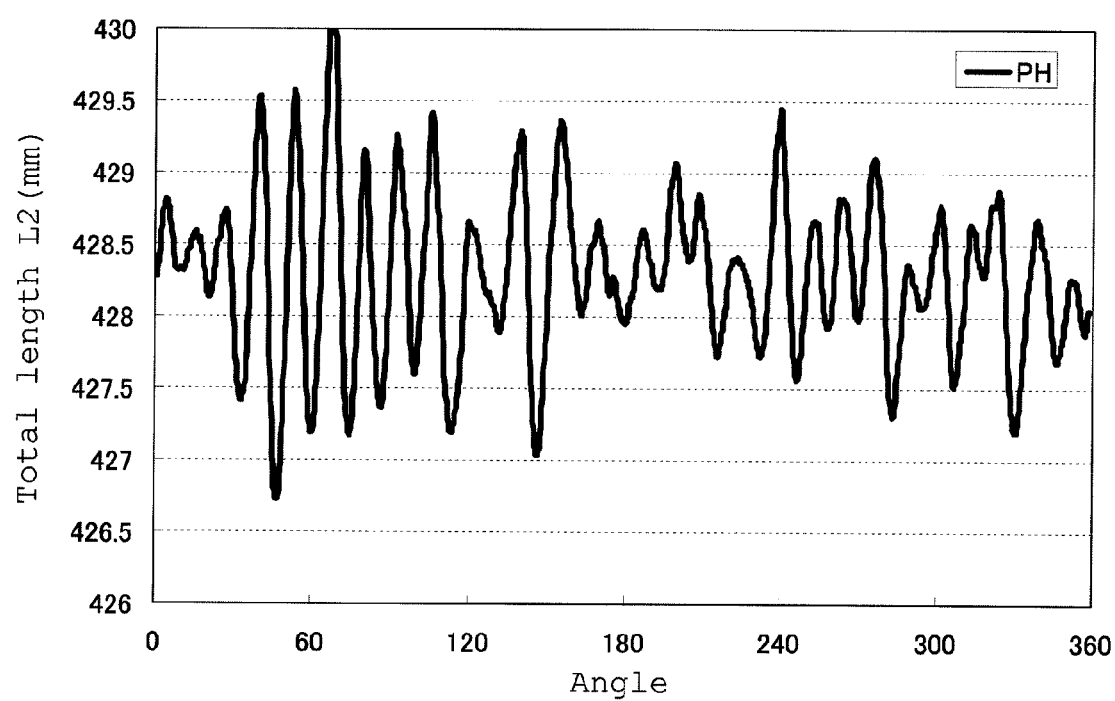
FIG. 45 is a graph showing another evaluation result of the golf ball according to Comparative Example 2.
Figure 48:
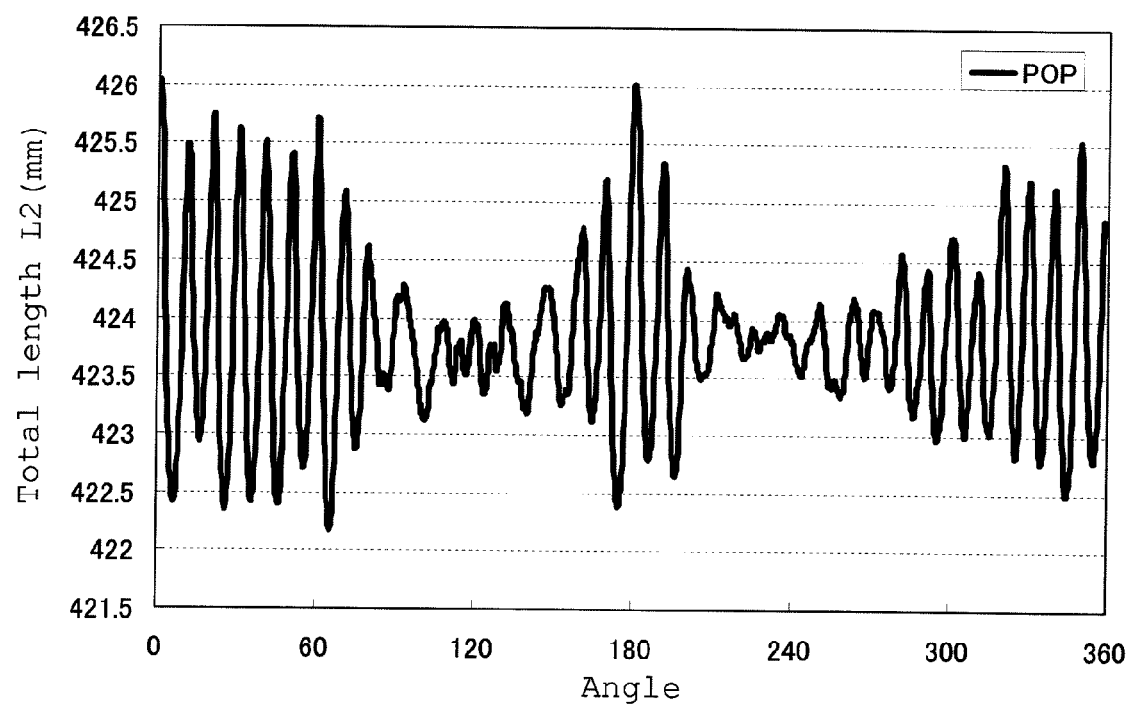
FIG. 48 is a graph showing an evaluation result of the golf ball according to Comparative Example 3.
Figure 49:
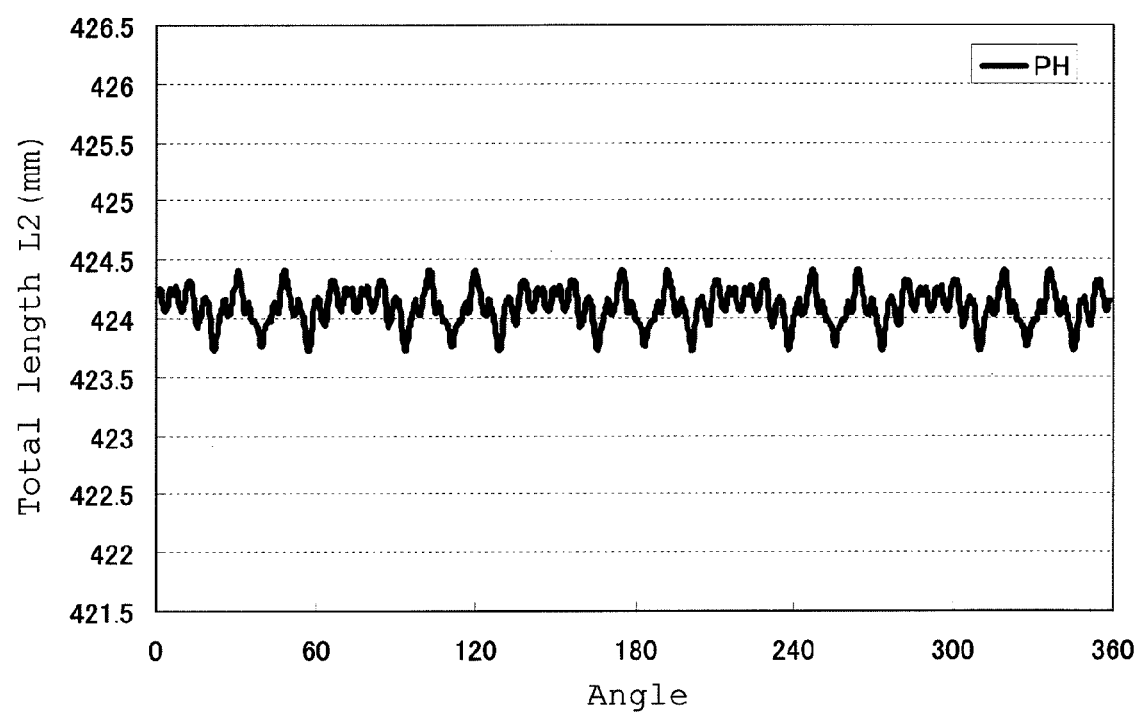
FIG. 49 is a graph showing another evaluation result of the golf ball according to Comparative Example 3.

|  |  | Example 2 | Compara. Example 2 | Compara. Example 3 |
|---|---|---|---|---|
| Maximum depth (mm) |  | 0.170 | 0.170 | 0.184 |
| Total volume (mm³) |  | 521.6 | 528 | 538 |
| POP rotation | Graph | FIG. 42 | FIG. 44 | FIG. 48 |
|  | Ro (mm) | 2.303 | 3.244 | 3.880 |
| PH rotation | Graph | FIG. 43 | FIG. 45 | FIG. 49 |
|  | Rh (mm) | 2.693 | 3.323 | 0.698 |
| dR (mm) |  | 0.390 | 0.079 | 3.182 |

As shown in Table 2, the fluctuation ranges Ro and Rh of the pattern of Example 2 are small. From the results of evaluation, advantages of the present invention are clear.

The rugged pattern described above is applicable to a one-piece golf ball, a multi-piece golf ball, and a thread-wound golf ball, in addition to a two-piece golf ball. The above descriptions are merely for illustrative examples, and various modifications can be made without departing from the principles of the present invention.

What is claimed is:

1. A process for designing a rugged pattern on a golf ball surface, the process comprising the steps of:
    (1) randomly arranging a large number of points on a surface of a phantom sphere;
    (2) assuming a large number of regions on the surface of the phantom sphere based on the points; and
    (3) assigning dimples and a land to the surface of the phantom sphere based on contours of the regions to form the rugged pattern;
    (4) forming a physical golf ball with the rugged pattern on the golf ball surface;
    wherein, at the step (2), a large number of the regions are assumed on the surface of the phantom sphere such that one of the points is included in one of the regions;
    wherein, at the step (2), the regions are assumed by a Voronoi tessellation; and
    wherein the step (2) comprises the steps of:
        (2.1) assuming a number of minute cells larger than a number of dimples on the surface of the phantom sphere;
        (2.2) selecting a generating point that is closest to each cell;
        (2.3) assuming, for each generating point, a set of cells for which said each generating point is a closest generating point; and
        (2.4) setting each set as a region obtained by the Voronoi tessellation.

2. The process according to claim 1, wherein, at the step (2), a large number of the regions are assumed on the surface of the phantom sphere by connecting one point to another point by a line.

3. The process according to claim 1, wherein, at the step (3), the land is assigned to a vicinity of each contour, and the dimple is assigned to a portion of the surface of the phantom sphere other than the land.

4. The process according to claim 1, wherein, at the step (1), a large number of the points are randomly arranged based on a Cellular Automaton method.

5. The process according to claim 4, wherein the step (1) comprises the steps of:
    (1.1) assuming a plurality of states;
    (1.2) assuming a large number of cells on the surface of the phantom sphere;
    (1.3) assigning any one of the states to each cell;
    (1.4) assigning, as an attribute of said each cell, any one of INSIDE, OUTSIDE, and BOUNDARY to said each cell based on the state of said each cell and states of a plurality of cells located adjacent to said each cell;
    (1.5) assuming a loop by connecting cells of BOUNDARY; and
    (1.6) deciding a central point of the loop.

* * * * *